United States Patent
Ravasio et al.

(10) Patent No.: US 7,800,943 B2
(45) Date of Patent: Sep. 21, 2010

(54) INTEGRATED CIRCUIT HAVING A MEMORY CELL ARRANGEMENT AND METHOD FOR READING A MEMORY CELL STATE USING A PLURALITY OF PARTIAL READINGS

(75) Inventors: Roberto Ravasio, Presezzo (IT); Detlev Richter, Munich (DE); Gert Koebernik, Unterhaching (DE); Girolamo Gallo, Padua (IT); Mirko Reissmann, Ottendorf-Okrilla (DE); Ramirez Xavier Veredas, Munich (DE)

(73) Assignee: Qimonda AG, Munich (DE)

( * ) Notice: Subject to any disclaimer, the term of this patent is extended or adjusted under 35 U.S.C. 154(b) by 243 days.

(21) Appl. No.: 12/016,750

(22) Filed: Jan. 18, 2008

(65) Prior Publication Data
US 2009/0185425 A1    Jul. 23, 2009

(51) Int. Cl.
G11C 11/34 (2006.01)
G11C 16/04 (2006.01)
G11C 16/06 (2006.01)

(52) U.S. Cl. .......................... 365/185.03; 365/185.02; 365/185.2; 365/185.21

(58) Field of Classification Search ............ 365/185.02, 365/185.03, 185.2, 185.21
See application file for complete search history.

(56) References Cited

U.S. PATENT DOCUMENTS 5,894,436 A    4/1999 Ohkawa et al.
6,542,407 B1 *    4/2003 Chen et al. ............. 365/185.17
7,180,123 B2 *    2/2007 Yeh et al. ..................... 257/314
2004/0179396 A1 *    9/2004 Yamada ................... 365/185.2
2005/0117401 A1 *    6/2005 Chen et al. ............. 365/189.01
2008/0117685 A1 *    5/2008 Syzdek et al. .......... 365/185.21
2008/0158985 A1 *    7/2008 Mokhlesi ............... 365/185.21

OTHER PUBLICATIONS

Campardo, G., et al., "VLSI-Design of Non-Volatile Memories," 2005, pp. XVII-580, Springer-Verlag, Berlin/Heidelberg.

\* cited by examiner

*Primary Examiner*—Ly D Pham

(57) ABSTRACT

Embodiments of the invention relate generally to an integrated circuit having a memory cell arrangement and a method for reading a memory cell state using a plurality of partial readings. In an embodiment of the invention, an integrated circuit having a memory cell arrangement is provided. The memory cell arrangement may include at least one memory cell, the memory cell being capable of storing a plurality of memory cell states being distinguishable by a predefined number of memory cell threshold values, and a controller configured to read a memory cell state of the at least one memory cell using a number of reference levels that is higher than the predefined number of memory cell threshold values, wherein the reading includes a first partial reading using a first set of a plurality of reference levels and a second partial reading using a second set of a plurality of reference levels, wherein the second set of a plurality of reference levels includes at least one reference level which is different from the reference levels of the first set of a plurality of reference levels.

25 Claims, 11 Drawing Sheets

FIG 6

INTEGRATED CIRCUIT HAVING A MEMORY CELL ARRANGEMENT AND METHOD FOR READING A MEMORY CELL STATE USING A PLURALITY OF PARTIAL READINGS

TECHNICAL FIELD

Embodiments of the invention relate generally to an integrated circuit having a memory cell arrangement and a method for reading a memory cell state using a plurality of partial readings.

BACKGROUND

It is desired to continuously increase the memory density and to reduce the costs per bit in a memory cell arrangement. One approach to increase the memory density is to provide a memory cell arrangement having memory cells which are coupled with each other in accordance with a NAND coupling structure. Furthermore, the memory cells tend to be configured to store a plurality of bits in each memory cell.

In a conventional NAND memory cell arrangement, usually a threshold voltage of a memory cell is converted into one or more digital values (in general, e.g., into N digits) through hard decision, which one or more digital values are provided at a memory cell arrangement-external interface for further processing.

If more bits of information were available outside the memory cell arrangement, e.g., outside the NAND memory cell arrangement, by way of example, error correction code (ECC) and digital signal processing (DSP) elaboration can be used to recover, for example, memory cell intrinsic gain loss or memory cell intrinsic distribution shift. Furthermore, a wider spread of ECC algorithms could be used as with hard decision information.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a diagram illustrating an iterative process for reading a memory cell state in accordance with an embodiment of the invention;

DETAILED DESCRIPTION OF ILLUSTRATIVE EMBODIMENTS

In an embodiment of the invention, more bits of information are obtained (also referred to as Soft Decoding) describing the status of a memory cell (e.g., using a memory cell threshold voltage ($V_t$)) without an increase of the complexity of the memory cell arrangement, e.g., of the NAND memory cell arrangement.

A first possible approach to receive a plurality of bits of information to represent a memory cell state of a memory cell capable of storing a plurality of memory cell states being distinguishable by a predefined number (e.g., a predefined number N, wherein N may be an integer value equal to or greater than two) of memory cell threshold values would be to provide a memory cell arrangement, which is capable to program and read a number of levels (e.g., threshold voltage levels) which is higher than the predefined number of memory cell threshold values, e.g., by an additional predefined number (e.g., an additional predefined number M, wherein M may be an integer value equal to or greater than one) of memory cell threshold values. In this approach, at least the (e.g., M) additional latches would be required in each page buffer as well as a rather complex algorithm implemented inside the memory cell arrangement (e.g., the NAND memory cell arrangement) in order to get the desired N+M bit of data as the plurality of bits of information. The complexity would be the same as compared to the complexity which would have to be provided in a memory cell arrangement being capable of storing (N+M) bits of information in each memory cell of the plurality of memory cells.

A second possible approach to receive a plurality of bits of information to represent a memory cell state of a memory cell capable of storing a plurality of memory cell states being distinguishable by a predefined number (e.g., a predefined number N, wherein N may be an integer value equal to or greater than two) of memory cell threshold values would be to get soft information performing multiple single level read operations with different voltage reference levels being provided, for example, by respective reference memory cells. This approach would require to perform $2^{(N+M)}-1$ read sequences and provide $2^{(N+M)}-1$ data at the output interface of the memory cell arrangement.

Figure 1:
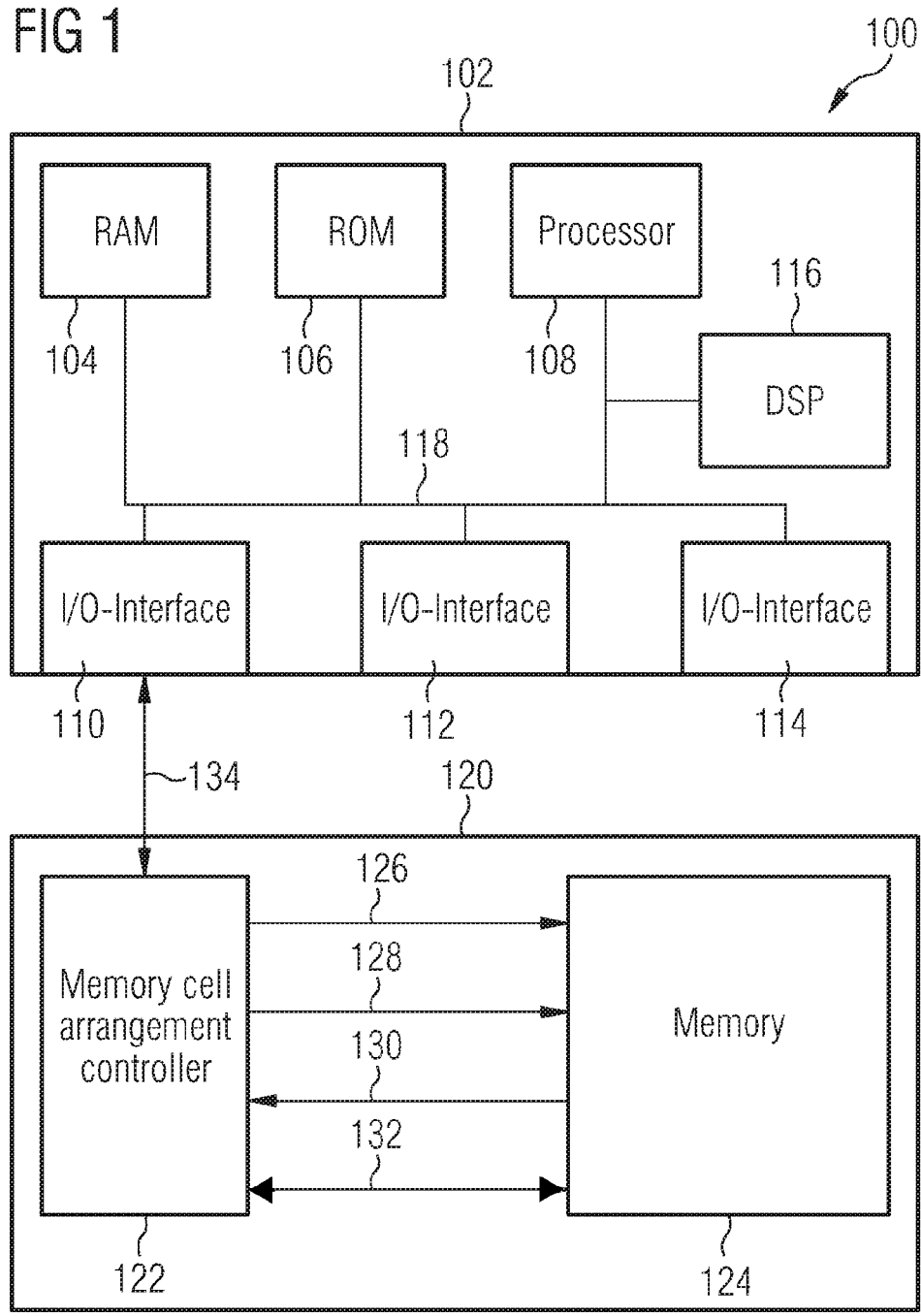
FIG. 1 shows a computer system having a memory cell arrangement in accordance with an embodiment of the invention.

FIG. 1 shows a computer system 100 having a computer arrangement 102 and a memory cell arrangement 120 in accordance with an embodiment of the invention.

In various embodiments of the invention, the computer arrangement 102 may be configured as or may include any device having a processor, e.g., having a programmable processor such as, e.g., a microprocessor (e.g., a CISC (complex instruction set computer) microprocessor or a RISC (reduced instruction set computer) microprocessor). In various embodiments of the invention, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), or another device having a processor (such as, e.g., a household appliance (such as, e.g., a washing machine, a dishwashing machine, etc.))

In an embodiment of the invention, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment of the invention, one or a plurality of input/output interfaces 110, 112, 114 (in FIG. 1, there are shown three input/output interfaces, in alternative embodiments of the invention, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment of the invention, each of the input/output interfaces 110, 112, 114 may be implemented in accordance with one of the following communication protocols:

- an ad hoc communication protocol such as, e.g., Firewire or Bluetooth;
- a communication protocol for a serial data transmission such as, e.g., RS-232, Universal Serial Bus (USB) (e.g., USB 1.0, USB 1.1, USB 2.0, USB 3.0);
- any other communication protocol such as e.g. Infrared Data Association (IrDA).

In an embodiment of the invention, the first input/output interface 110 is a USB interface (in alternative embodiments of the invention, the first input/output interface 110 may be configured in accordance with any other communication protocol such as, e.g., in accordance with a communication protocol which has been described above).

In an embodiment of the invention, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment of the invention, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment of the invention, may include the memory cell arrangement 120.

The memory cell arrangement 120 may in an embodiment of the invention be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment of the invention, the memory cell arrangement 120 is configured as a memory card.

In an embodiment of the invention, the memory cell arrangement 120 may include a memory cell arrangement controller 122 (for example, implemented by means of hard wired logic and/or by means of one or a plurality of programmable processors, e.g., by means of one or a plurality of programmable processors such as, e.g., one or a plurality of programmable microprocessors (e.g., CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment of the invention, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment of the invention, the memory cell arrangement controller 122 may be coupled to the first input/output interface 110 by means of a communication connection 134 (e.g., by means of a USB communication connection).

In an embodiment of the invention, the memory 124 may include one chip or a plurality of chips. Furthermore, the memory cell arrangement controller 122 may be implemented on the same chip (or die) as the components of the memory 124 or on a separate chip (or die).

Figure 2:
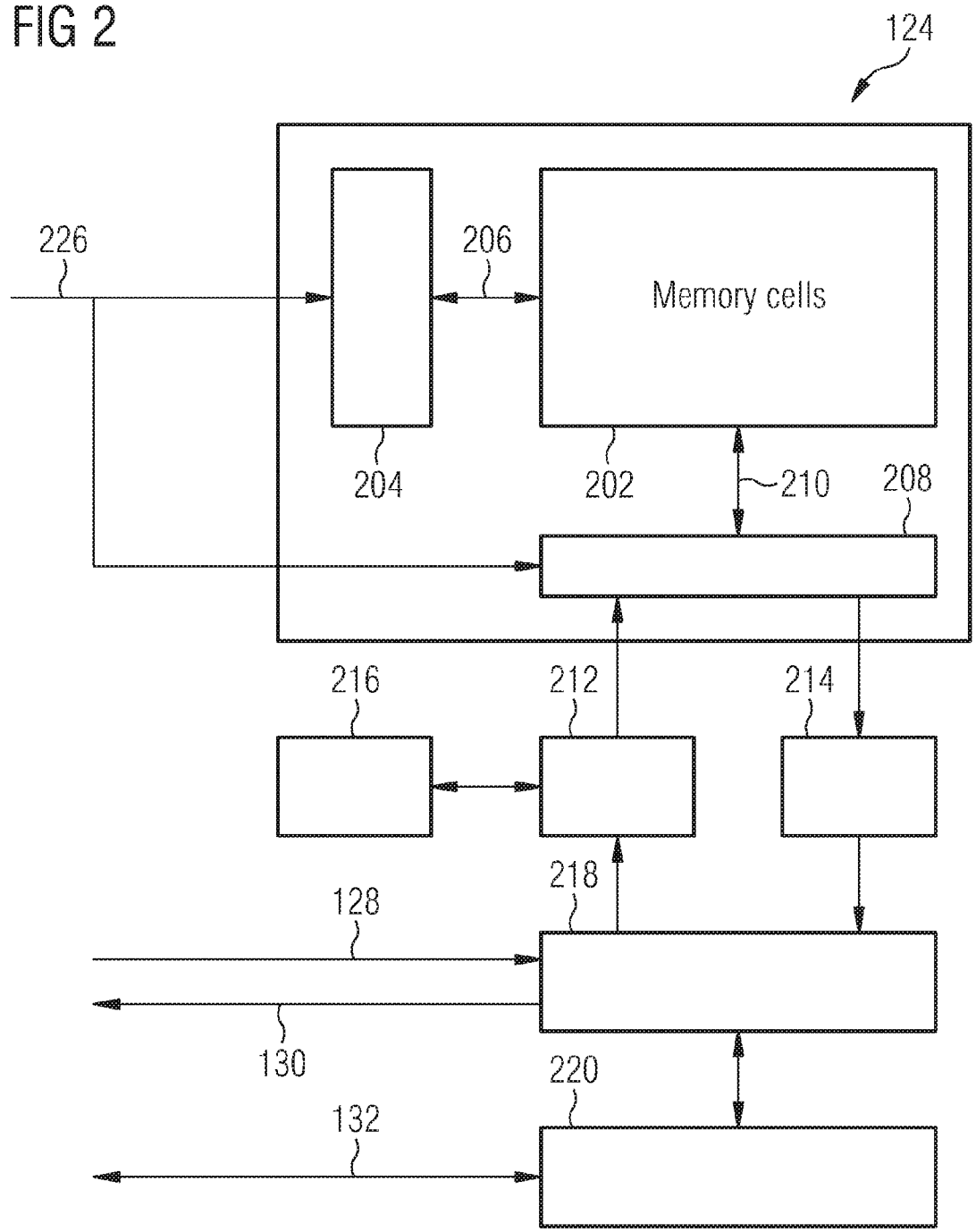
FIG. 2 shows a memory cell field in accordance with an embodiment of the invention.

FIG. 2 shows the memory 124 of FIG. 1 in accordance with an embodiment of the invention in more detail.

In an embodiment of the invention, the memory 124 may include a memory cell field (e.g., a memory cell array) 202 having a plurality of memory cells. The memory cells may be arranged in the memory cell field 202 in the form of a matrix in rows and columns, or, alternatively, for example, in zig-zag form. In other embodiments of the invention, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment of the invention, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment of the invention, the memory cells are non-volatile memory cells.

A "non-volatile memory cell" may be understood as a memory cell storing data even if it is not active. In an embodiment of the invention, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of:
  charge storing random access memory cells (e.g., floating gate memory cells or charge trapping memory cells);
  ferroelectric random access memory cells (FeRAM, FRAM);
  magnetoresistive random access memory cells (MRAM);
  phase change random access memory cells (PCRAM, for example so called Ovonic Unified Memory (OUM) memory cells);
  conductive filament random access memory cells (e.g., conductive bridging random access memory cells (CBRAM), also referred to as programmable metallization cells (PMC), or carbon-based conductive filament random access memory cells);
  organic random access memory cells (ORAM);
  nanotube random access memory cells (NRAM) (e.g., carbon nanotube random access memory cells);
  nanowire random access memory cells.

In alternative embodiments of the invention, also other types of non-volatile memory cells may be used.

In various embodiments of the invention, the memory cells may be resistive memory cells.

Furthermore, the memory cells may be electrically erasable read only memory memory cells (EEPROM).

In an embodiment of the invention, the memory cells may be Flash memory cells, e.g., charge storing memory cells such as, e.g., floating gate memory cells or charge trapping memory cells.

In an embodiment of the invention, each charge trapping memory cell includes a charge trapping layer structure for trapping electrical charge carriers. The charge trapping layer structure may include one or a plurality of two separate charge trapping regions. In an embodiment of the invention, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment of the invention, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment of the invention, the charge trapping layer structure includes two, four or even more dielectric layers being formed above one another.

In an embodiment of the invention, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment of the invention, the memory cells may be multi-level memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment of the invention, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row und thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing one memory cell or of a plurality of memory cells, are applied to the selected at least one row control line 206 and to the at least one column control line 210.

In the case that each memory cell is configured in the form of a field effect transistor (e.g., in the case of a charge storing memory cell), in an embodiment of the invention, the respective gate terminal is coupled to the row control line 206 and a first source/drain terminal is coupled to a first column control line 210. A second source/drain terminal may be coupled to a second column control line 210. Alternatively, with a first source/drain terminal of an adjacent memory cell, which may then, e.g., also be coupled to the same row control line 206 (this is the case, e.g., in a NAND arrangement of the memory cells in the memory cell field 202).

In an embodiment of the invention, by way of example, for reading or for programming, a single row control line 206 and a single column control line 210 are selected at the same time and are appropriately driven for reading or programming of the thus selected memory cell. In an alternative embodiment of the invention, it may be provided to respectively select a single row control line 206 and a plurality of column lines 210 at the same time for reading or for programming, thereby allowing to read or program a plurality of memory cells at the same time.

Furthermore, in an embodiment of the invention, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented, e.g., by means of an electrical current, which flows through the addressed memory cell and the corresponding column control line 210, which may be compared with a current threshold value in order to determine the content of the memory cell, wherein the current threshold value may, e.g., be dependent from the reference memory cells 216) are, e.g., buffered in the read buffer memory 214 during the read operation. The result of the comparison und therewith the logic state of the memory cell (wherein the logic state of the memory cell represents the memory content of the memory cell) may then be stored in the data register 218 and may be provided via the data read connection 130, with which the data register 218 may be coupled.

The access operations (e.g., write operations, read operations, or erase operations) may be controlled by a memory-internal controller 220, which in turn may be controlled by the memory cell arrangement controller 122 by means of the bidirectional control/state connection 132. In an alternative embodiment of the invention, the data register 218 may directly be connected to the memory cell arrangement controller 122 by means of the bidirectional control/state connection 132 and thus directly controlled thereby. In this example, the memory-internal controller 220 may be omitted.

In an embodiment of the invention, the memory cells of the memory cell field may be grouped into memory blocks or memory sectors, which may be commonly erased in an erase operation. In an embodiment of the invention, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 124, but they are neither shown in FIG. 1 nor FIG. 2 for reasons of clarity.

Figure 3:
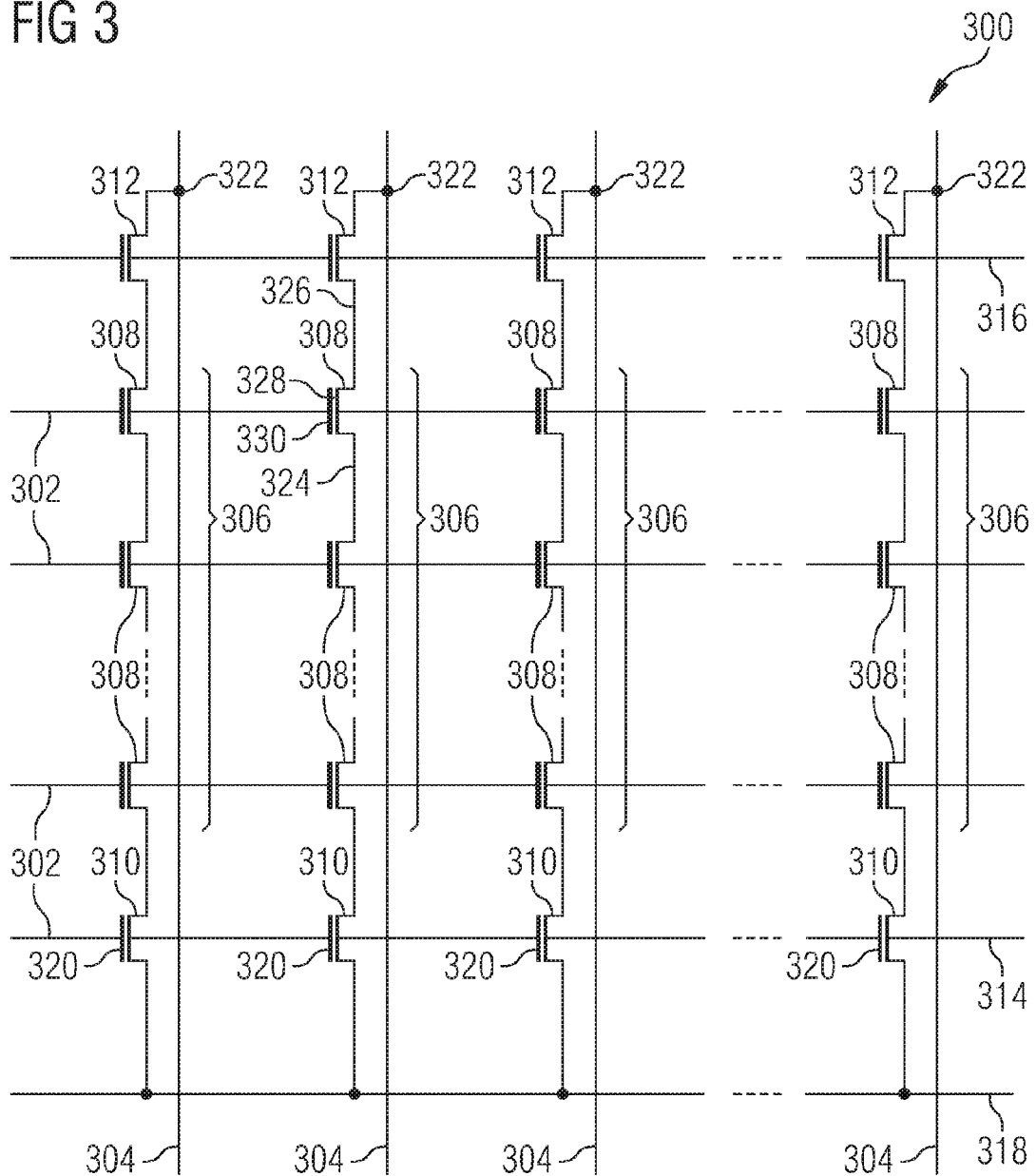
FIG. 3 shows an example of the memory cell field of FIG. 2 in accordance with an embodiment of the invention.

FIG. 3 shows a memory cell portion 300 of the memory cell field 202 in accordance with an embodiment of the invention.

In one embodiment of the invention, the memory cell portion 300 is arranged as a NAND memory cell field (although another coupling architecture may be provided in an alternative embodiment of the invention).

In an embodiment of the invention, the NAND memory cell portion 300 (e.g., a NAND memory cell array portion 300) may include word lines 302 (in general, an arbitrary number of word lines 302, in one embodiment of the invention, 1024 word lines 302) and intersecting bit lines 304 (in general, an arbitrary number of bit lines 304, in one embodiment of the invention, 512 bit lines 304).

The NAND memory cell array portion 300 may include NAND strings 306, each NAND string 306 having memory cells 308 (e.g., charge storing memory cells 308 such as, e.g., charge trapping memory cells 308 or floating gate memory cells 308). Furthermore, an arbitrary number of memory cells 308 can be provided in the NAND string 306, in accordance with one embodiment of the invention, 32 memory cells 308. The memory cells 308 are connected in series, source-to-drain, between a source select gate 310, which may be implemented as a field effect transistor, and a drain select gate 312, which may also be implemented as a field effect transistor. Each source select gate 310 is positioned at an intersection of a bit line 304 and a source select line 314. Each drain select gate 312 is positioned at an intersection of a bit line 304 and a drain select line 316. The drain of each source select gate 310 is connected to the source terminal of the first charge trapping memory cells 308 of the corresponding NAND string 306. The source of each source select gate 310 is connected to a common source line 318. A control gate 320 of each source select gate 310 is connected to the source select line 314.

In one embodiment of the invention, the common source line 318 is connected between source select gates 310 for NAND strings 306 of two different NAND arrays. Thus, the two NAND arrays share the common source line 318.

In an embodiment of the invention, the drain of each drain select gate 312 may be connected to the bit line 304 of the corresponding NAND string 306 at a drain contact 322. The source of each drain select gate 312 is connected to the drain of the last charge trapping memory cell 308 of the corresponding NAND string 306. In one embodiment of the invention, at least two NAND strings 306 share the same drain contact 322.

In accordance with the described embodiments, each memory cell 308 may include a source 324 (e.g., a first source/drain region), a drain 326 (e.g., a second source/drain region), a charge storage region 328 (e.g., a floating gate stack or a dielectric layer stack) and a control gate 330 (e.g., a gate region). The control gate 330 of each memory cell 308 may be connected to a respective word line 302. A column of the NAND memory cell array portion 300 may include a respective NAND string 306 and a row of the NAND memory cell array portion 300 may include those memory cells 308 that are commonly connected to a respective word line 302.

In an alternative embodiment of the invention, the memory cell portion 300 is a NOR memory cell array portion 300. In yet another embodiment of the invention, the memory cell portion 300 may be arranged in accordance with any other suitable architecture.

In an embodiment of the invention, the embodiments are described in more detail with reference to a NAND multi-level memory cell arrangement. In a NAND multi-level memory cell arrangement that is configured to store N bit/cell (wherein N is, e.g., an integer greater than 1), at least $2^N-1$ reference memory elements (e.g., $2^N-1$ reference memory cells) and N internal memory elements (e.g., N memory cells in the read buffer memory 214 for each read memory cell are required.

Figure 4:
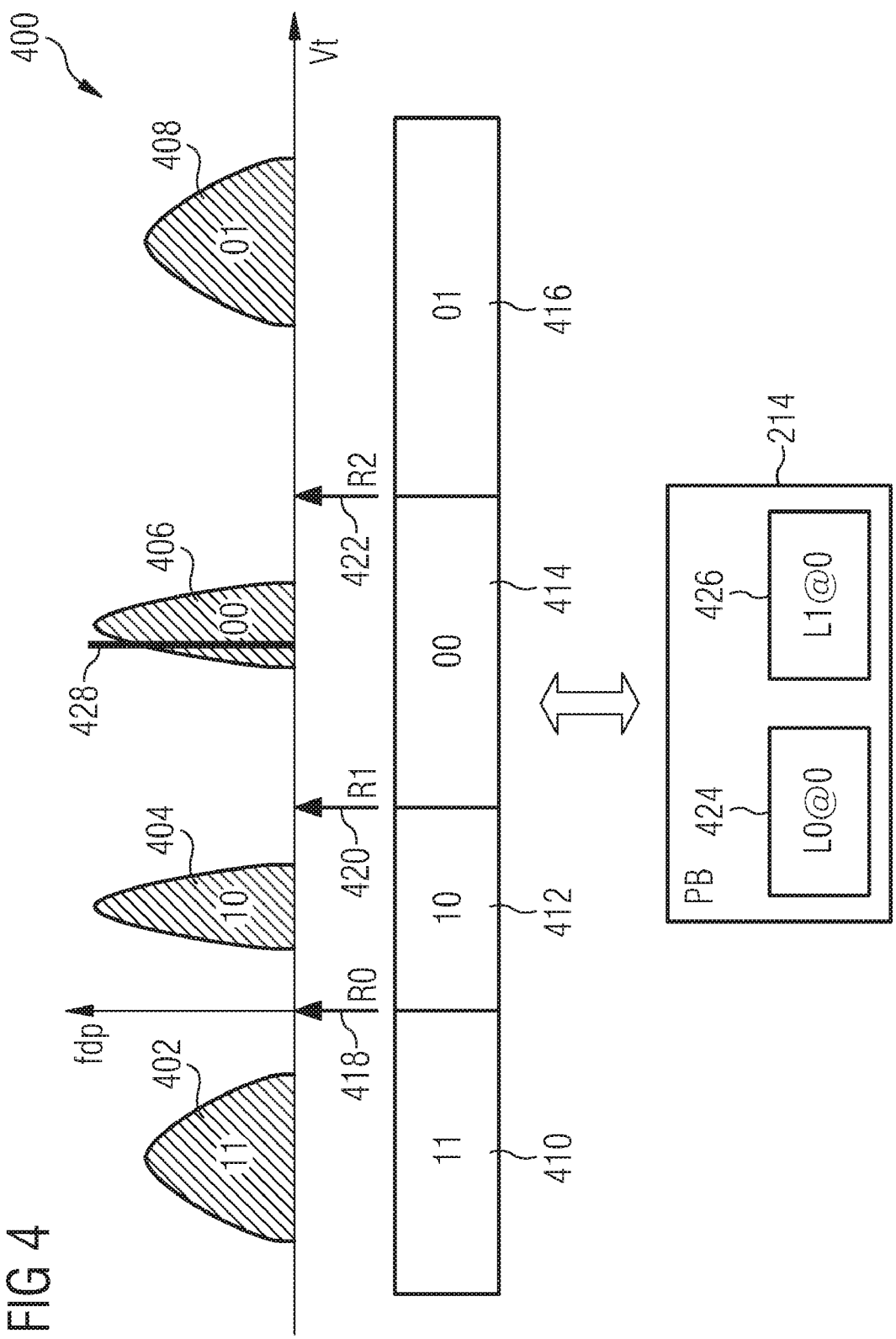
FIG. 4 shows an example of four possible states of 2-bit multi-level NAND memory cells in accordance with an embodiment of the invention.

FIG. 4 shows an example of four possible states of 2-bit multi-level NAND memory cells in accordance with an embodiment of the invention in a memory cell state diagram 400. In this example, the memory cells may be in either of the following four memory cell states:
  a first memory cell state represented by a first memory cell state voltage distribution 402 (representing a first logic state "11" 410);
  a second memory cell state represented by a second memory cell state voltage distribution 404 (representing a second logic state "10" 412);
  a third memory cell state represented by a third memory cell state voltage distribution 406 (representing a third logic state "00" 414); and
  a fourth memory cell state represented by a fourth memory cell state voltage distribution 408 (representing a fourth logic state "01" 416).

The four possible memory cell states can be distinguished from each other since their assigned memory cell state voltage distributions 402, 404, 406, 408, are separated from each other. In order to distinguish the memory cell states, a predefined number of memory cell threshold values are provided. In this example, three memory cell threshold values are provided, for example:
  a first memory cell threshold value R0 418, which is selected such that it represents a voltage value that lies between the first memory cell state voltage distribution 402 and the second memory cell state voltage distribution 404;
  a second memory cell threshold value R1 420, which is selected such that it represents a voltage value that lies between the second memory cell state voltage distribution 404 and the third memory cell state voltage distribution 406; and
  a third memory cell threshold value R2 422, which is selected such that it represents a voltage value that lies between the third memory cell state voltage distribution 406 and the fourth memory cell state voltage distribution 408.

In an embodiment of the invention, as described above, predetermined read voltages are applied to the addressed memory cell to be read and the electrical current, which flows through the addressed memory cell and the corresponding column control line 210 (in FIG. 4 symbolized by means of a determined level 428) is compared with the (e.g., current or voltage) threshold values 418, 420, 422, in order to determine the content of the addressed memory cell. The result of the comparison and therewith the logic state 410, 412, 414, 416 of the memory cell (wherein the logic state of the memory cell represents the memory content of the memory cell) is buffered in the read buffer memory 214 (e.g., also referred to as a page buffer) (which in this example includes a first read buffer memory cell 424 to store, e.g., the most significant bit of the logic state of the addressed memory cell and a second read buffer memory cell 426 to store, e.g., the least significant bit of the logic state of the addressed memory cell) and then may be forwarded to the data register 218 and may be provided via the data read connection 130, with which the data register 218 may be coupled, e.g., to the memory cell arrangement controller 122.

Thus, $2^N-1$ references (e.g., $2^N-1$ memory cell threshold values) are provided to identify one of the $2^N$ possible memory cell states and the N memory elements are provided to store the result of a Hard Decision Read. Usually, at least N memory elements are also provided in a programming operation.

As will be described in more detail below, embodiments of the invention provide a method to receive soft information from NAND memories with no page buffer area penalty (compared to a hard decision information case) and with a good performance (e.g., with respect to the time consumption required for a read operation).

Figure 5:
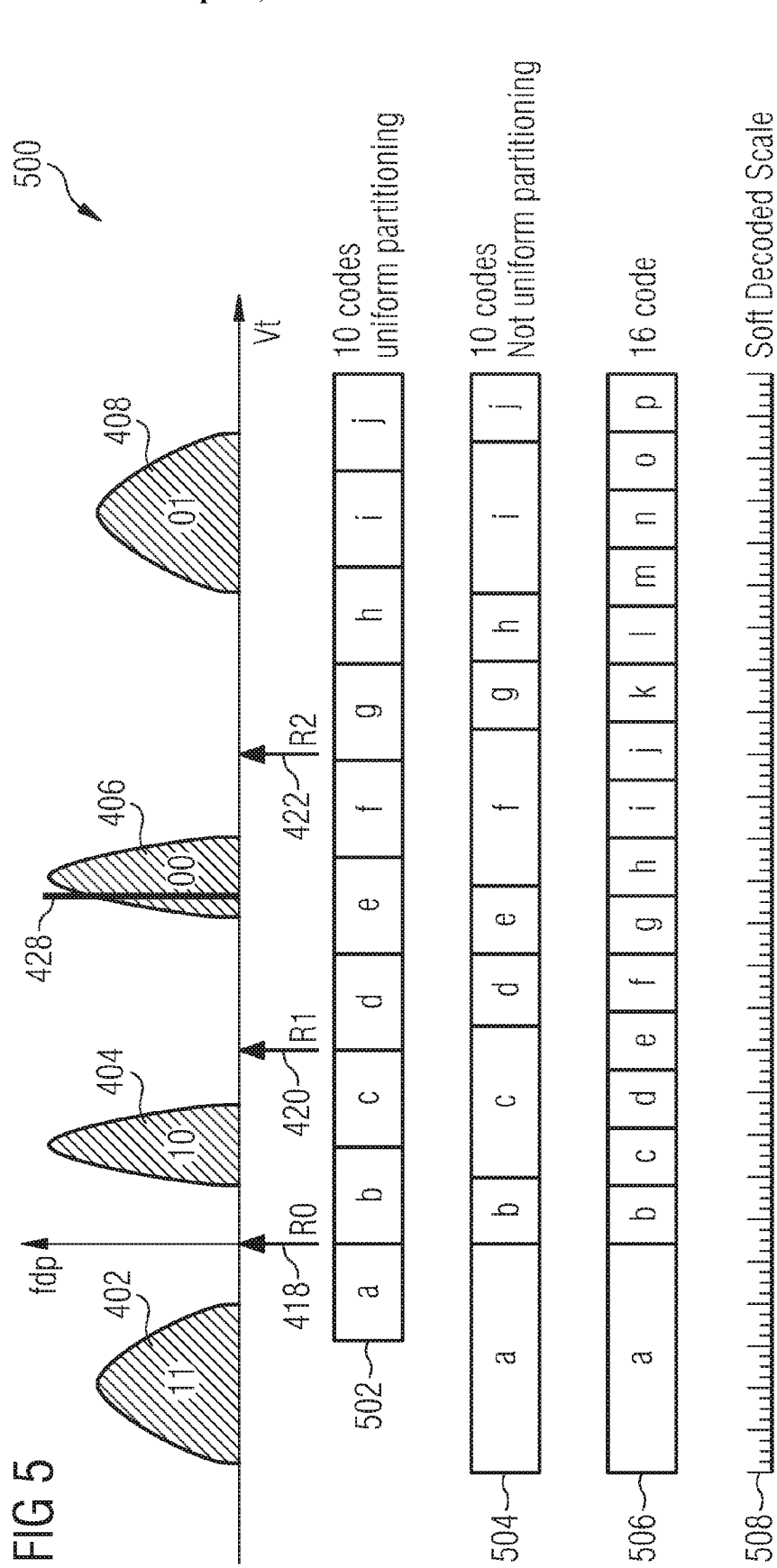
FIG. 5 shows an example of four possible states of 2-bit multi-level NAND memory cells and a higher number of codes for providing soft read information in accordance with an embodiment of the invention.

FIG. 5 shows an example of four possible states of 2-bit multi-level NAND memory cells and a higher number of codes for providing soft read information in accordance with an embodiment of the invention in a diagram 500.

In various embodiments of the invention, not only $2^N-1$ references (e.g., $2^N-1$ memory cell threshold values) are provided to allow a hard decision read, but more than the $2^N-1$ references (e.g., $2^N-1$ memory cell threshold values) are provided (in general, more than the predefined number of memory cell threshold values required to hard distinguish between the memory cell states). Illustratively, the space between the memory cell state voltage distributions 402, 404, 406, 408, is not only separated by means of exactly one memory cell threshold value, but at least one space (e.g., a plurality of spaces or all spaces) between the memory cell state voltage distributions 402, 404, 406, 408, may be separated using a plurality of memory cell threshold values, thereby receiving a more accurate information (in the following also referred to as soft information) regarding the actual memory cell state of the addressed memory cell. Illustratively, in an embodiment of the invention, this may be considered as a kind of oversampling of the voltage interval that is used to determine or classify the actual memory cell state of the addressed memory cell. Thus, a finer granularity of the voltage interval covered by the memory cell state voltage distributions 402, 404, 406, 408, and the spaces therebetween may be provided.

In other words, a number of classification intervals (in FIG. 5 denoted with the reference signs a, b, c, d, e, f, g, h, i, j) is provided that is higher than $2^N-1$, wherein $2^N$ represents the number of possible memory cell states 410, 412, 414, 416. By way of example, the voltage intervals covered by the memory cell state voltage distributions 402, 404, 406, 408, and the spaces therebetween are partitioned into a number of classification intervals a, b, c, d, e, f, g, h, i, j, that is higher than $2^N-1$. The classification intervals a, b, c, d, e, f, g, h, i, j, may have the same size (in other words, a uniform partitioning of the classification intervals a, b, c, d, e, f, g, h, i, j, is provided) as shown in FIG. 5 with a first set 502 of classification intervals a, b, c, d, e, f, g, h, i, j. In another example, the classification intervals a, b, c, d, e, f, g, h, i, j, may have different sizes compared with each other (in other words, a non-uniform partitioning of the classification intervals a, b, c, d, e, f, g, h, i, j, may be provided) as shown in FIG. 5 with a second set 504 of classification intervals a, b, c, d, e, f, g, h, i, j. In an embodiment of the invention, the respective classification intervals a, b, c, d, e, f, g, h, i, j, are separated from each other by means of respective memory cell threshold values (the number of which is higher than e.g. $2^N-1$).

In order to avoid providing more than the predetermined number (e.g., $2^N-1$) of memory cell threshold values at the same time (which would lead to the need for additional reference cells, for example), in an embodiment of the invention, an iterative process is provided, in which, by way of example, a plurality of "sliding" memory cell threshold values are provided in each iteration (e.g., the predetermined number (e.g., $2^N-1$) of memory cell threshold values), wherein at least some of the memory cell threshold values in different iterations are different from each other. By way of example, in a first iteration, a first set of memory cell threshold values may be used in a first partial read operation, and in a second iteration, a second set of memory cell threshold values (with at least some of the memory cell threshold values being different from the memory cell threshold values used in the first iteration) may be used in a second partial read operation. After having completed all iterations (and thus all partial read operations), the results of the comparisons of the respectively read electrical characteristic of the addressed memory cell (such as, e.g., the read current or voltage) are used to generate the soft information, which may be provided for further processing, which will be described in more detail below. By way of example, the soft information may be used to perform further digital signal processing (e.g., by a digital signal processor (DSP)) and/or soft-error correction code (ECC) elaboration.

In an embodiment of the invention, a code set may be assigned to the classification intervals a, b, c, d, e, f, g, h, i, wherein one code value is respectively to each of the classification intervals a, b, c, d, e, f, g, h, i. The code values may represent a predefinable weighting value which further weights the assigning of the respectively read electrical characteristic to a respective classification interval. An example of such a code set will be described in more detail below. Thus, in an embodiment of the invention, the information associated to the classification intervals (also referred to as cell region code) is higher than in a hard decision scheme and will also be referred to as soft information. With the knowledge of the respectively assigned cell code region and the threshold voltage ($V_t$) references it is possible to get for each memory cell an improved threshold estimation using a proper number of bits.

It is to be noted that any number of classification intervals may be provided in an alternative embodiment of the invention. For example, as shown in FIG. 5, in an alternative embodiment of the invention, a third set 506 of classification intervals a, b, c, d, e, f, g, h, i, j, k, l, m, n, o, p could be provided (which may also be partitioned in a uniform or in a non-uniform manner).

By providing the finer scalable classification intervals, in general, an arbitrarily fine granular scale 508 may be provided in order to provide an almost as accurate soft information as desired.

In order to efficiently get from the memory all the soft information without adding more memory cells for read operations to read the content of a memory cell, in an embodiment of the invention, a process is provided which will be described in more detail below.

Figure 6:
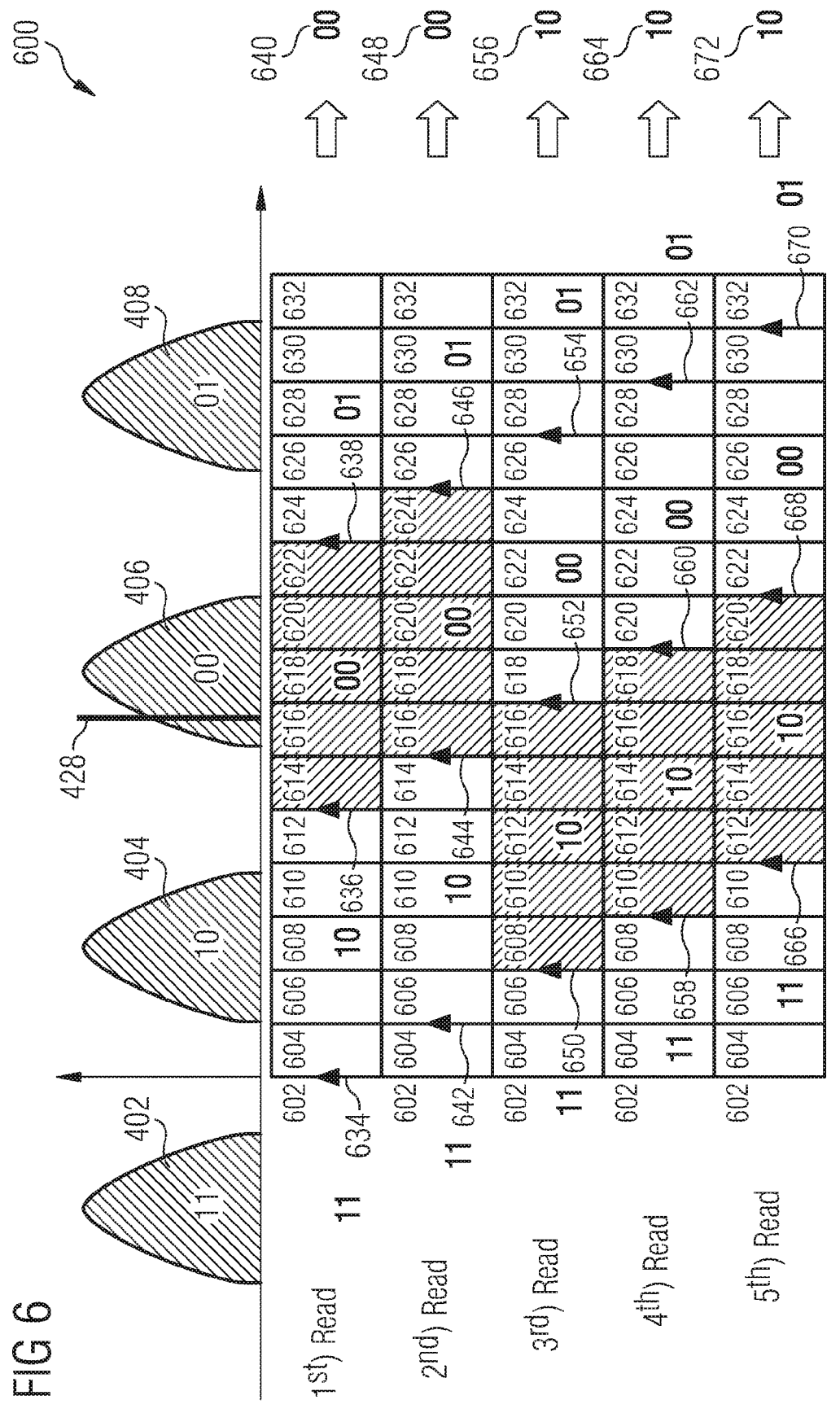

FIG. 6 shows a diagram 600 which illustrates an iterative process for reading a memory cell state in accordance with an embodiment of the invention.

As shown in FIG. 6, the entire evaluation interval for reading the memory cell state of a memory cell is, e.g., grouped into a plurality of 16 classification intervals 602, 604, 606, 608, 610, 612, 614, 616, 618, 620, 622, 624, 626, 628, 630.

For the first read iteration
the first classification interval 602, is assigned to a first preliminary code "11";
the second classification interval 604, the third classification interval 606, the fourth classification interval 608, the fifth classification interval 610 and the sixth classification interval 612 are assigned to a second preliminary code "10";
the seventh classification interval 614, the eighth classification interval 616, the ninth classification interval 618, the tenth classification interval 620 and the eleventh classification interval 622 are assigned to a third preliminary code "00"; and
the twelfth classification interval 624, the thirteenth classification interval 626, the fourteenth classification interval 628, the fifteenth classification interval 630 and the sixteenth classification interval 632 are assigned to a second preliminary code "01".

As shown in the example of FIG. 6, the determined level 428 is compared with a set of three first iteration references (e.g., 3 memory cell threshold values) provided, e.g., by means of three reference memory cells, for example. In this embodiment of the invention it is assumed that the memory cell arrangement is configured such that it can only provide the predefined number of references in each iteration (in other words, it cannot provide more references than the predefined number of references, for example), although the references themselves (in other words, the values of the references, e.g., the memory cell threshold values) may vary in the different iterations, as will be described in more detail below. In the first iteration, a first iteration first memory cell threshold value 634, a first iteration second memory cell threshold value 636 and a first iteration third memory cell threshold value 638 are provided. In this example, the first iteration first memory cell threshold value 634 is selected such that it lies between the first classification interval 602 and the second classification interval 604, the first iteration second memory cell threshold value 636 lies between the sixth classification interval 612 and the seventh classification interval 614, and the first iteration third memory cell threshold value 638 lies between the eleventh classification interval 622 and the twelfth classification interval 624.

As shown in FIG. 6, in this example, in the first read iteration, it is determined that the determined level 428 is higher than the first iteration second memory cell threshold value 636 and lower than the first iteration third memory cell threshold value 638. Therefore, in the first read iteration, the third preliminary code "00" is preliminarily stored in a buffer memory (not shown in FIG. 6) and assigned to the determined level 428 for the first read iteration (symbolized in FIG. 6 with reference number 640).

Then, a second read iteration is carried out. For the second read iteration
the first classification interval 602 and the second classification interval 604 are assigned to the first preliminary code "11";
the third classification interval 606, the fourth classification interval 608, the fifth classification interval 610, the sixth classification interval 612 and the seventh classification interval 614 are assigned to the second preliminary code "10";
the eighth classification interval 616, the ninth classification interval 618, the tenth classification interval 620, the eleventh classification interval 622 and the twelfth classification interval 624 are assigned to the third preliminary code "00"; and the thirteenth classification interval 626, the fourteenth classification interval 628, the fifteenth classification interval 630 and the sixteenth classification interval 632 are assigned to the fourth preliminary code "01".

In the second iteration, a different set of references (but again the same number of reference, e.g., three references) are used compared with the first read iteration. As shown in the example of FIG. 6, in the second read iteration, the determined level 428 is compared with a set of three second iteration references (e.g., 3 memory cell threshold values), again provided by means of three reference memory cells, for example. In the second iteration, a second iteration first memory cell threshold value 642, a second iteration second memory cell threshold value 644 and a second iteration third memory cell threshold value 646 are provided. In this example, the second iteration first memory cell threshold value 642 is selected such that it lies between the second classification interval 604 and the third classification interval 606, the second iteration second memory cell threshold value 644 lies between the seventh classification interval 614 and the eighth classification interval 616, and the second iteration third memory cell threshold value 646 lies between the twelfth classification interval 624 and the thirteenth classification interval 626.

As shown in FIG. 6, in this example, in the second read iteration, it is determined that the determined level 428 is higher than the second iteration second memory cell threshold value 644 and lower than the second iteration third memory cell threshold value 646. Therefore, in the second read iteration, the third preliminary code "00" is preliminarily stored in a buffer memory (not shown in FIG. 6) and assigned to the determined level 428 for the second read iteration (symbolized in FIG. 6 with reference number 648).

Subsequently, a third read iteration is carried out. For the third read iteration the first classification interval 602, the second classification interval 604 and the third classification interval 606 are assigned to the first preliminary code "11";

the fourth classification interval 608, the fifth classification interval 610, the sixth classification interval 612, the seventh classification interval 614 and the eighth classification interval 616 are assigned to the second preliminary code "10";

the ninth classification interval 618, the tenth classification interval 620, the eleventh classification interval 622, the twelfth classification interval 624 and the thirteenth classification interval 626 are assigned to the third preliminary code "00"; and the fourteenth classification interval 628, the fifteenth classification interval 630 and the sixteenth classification interval 632 are assigned to the fourth preliminary code "01".

In the third iteration, yet a different set of references (but again the same number of reference, e.g., three references) are used compared with the first read iteration and the second read iteration. As shown in the example of FIG. 6, in the third read iteration, the determined level 428 is compared with a set of three third iteration references (e.g., three memory cell threshold values), again provided, e.g., by means of three reference memory cells, for example. In the third iteration, a third iteration first memory cell threshold value 650, a third iteration second memory cell threshold value 652 and a third iteration third memory cell threshold value 654 are provided. In this example, the third iteration first memory cell threshold value 650 is selected such that it lies between the third classification interval 606 and the fourth classification interval 608, the third iteration second memory cell threshold value 652 lies between the eighth classification interval 616 and the ninth classification interval 618, and the third iteration third memory cell threshold value 654 lies between the thirteenth classification interval 626 and the fourteenth classification interval 628.

As shown in FIG. 6, in this example, in the third read iteration, it is determined that the determined level 428 is higher than the third iteration first memory cell threshold value 650 and lower than the third iteration second memory cell threshold value 652. Therefore, in the third read iteration, the second preliminary code "10" is preliminarily stored in a buffer memory (not shown in FIG. 6) and assigned to the determined level 428 for the third read iteration (symbolized in FIG. 6 with reference number 656).

Then, a fourth read iteration is carried out. For the fourth read iteration the first classification interval 602, the second classification interval 604, the third classification interval 606 and the fourth classification interval 608 are assigned to the first preliminary code "11";

the fifth classification interval 610, the sixth classification interval 612, the seventh classification interval 614, the eighth classification interval 616 and the ninth classification interval 618 are assigned to the second preliminary code "10";

the tenth classification interval 620, the eleventh classification interval 622, the twelfth classification interval 624, the thirteenth classification interval 626 and the fourteenth classification interval 628 are assigned to the third preliminary code "00"; and the fifteenth classification interval 630 and the sixteenth classification interval 632 are assigned to the fourth preliminary code "01".

In the fourth iteration, yet a different set of references (but again the same number of reference, e.g., three references) are used compared with the first read iteration, the second read iteration and the third read iteration. As shown in the example of FIG. 6, in the fourth read iteration, the determined level 428 is compared with a set of three fourth iteration references (e.g., three memory cell threshold values), again provided, e.g., by means of three reference memory cells, for example. In the fourth iteration, a fourth iteration first memory cell threshold value 658, a fourth iteration second memory cell threshold value 660 and a fourth iteration third memory cell threshold value 662 are provided. In this example, the fourth iteration first memory cell threshold value 658 is selected such that it lies between the fourth classification interval 608 and the fifth classification interval 610, the fourth iteration second memory cell threshold value 660 lies between the ninth classification interval 618 and the tenth classification interval 620, and the fourth iteration third memory cell threshold value 662 lies between the fourteenth classification interval 628 and the fifteenth classification interval 630.

As shown in FIG. 6, in this example, in the fourth read iteration, it is determined that the determined level 428 is higher than the fourth iteration first memory cell threshold value 658 and lower than the fourth iteration second memory cell threshold value 660. Therefore, in the fourth read iteration, the second preliminary code "10" is preliminarily stored in a buffer memory (not shown in FIG. 6) and assigned to the determined level 428 for the fourth read iteration (symbolized in FIG. 6 with reference number 664).

Finally, in this example, a fifth read iteration is carried out. For the fifth read iteration the first classification interval 602, the second classification interval 604, the third classification interval 606, the fourth classification interval 608 and the fifth classification interval 610 are assigned to the first preliminary code "11";

the sixth classification interval 612, the seventh classification interval 614, the eighth classification interval 616, the ninth classification interval 618 and the tenth classification interval 620 are assigned to the second preliminary code "10";

the eleventh classification interval 622, the twelfth classification interval 624, the thirteenth classification interval 626, the fourteenth classification interval 628 and the fifteenth classification interval 630 are assigned to the third preliminary code "00"; and the sixteenth classification interval 632 is assigned to the fourth preliminary code "01".

In the fifth iteration, yet a different set of references (but again the same number of reference, e.g., three references) are used compared with the first read iteration, the second read iteration, the third read iteration and the fourth iteration. As shown in the example of FIG. 6, in the fifth read iteration, the determined level 428 is compared with a set of three fifth iteration references (e.g., three memory cell threshold values), again provided, e.g., by means of three reference memory cells, for example. In the fifth iteration, a fifth iteration first memory cell threshold value 666, a fifth iteration second memory cell threshold value 668 and a fifth iteration third memory cell threshold value 670 are provided. In this example, the fifth iteration first memory cell threshold value 666 is selected such that it lies between the fifth classification interval 610 and the sixth classification interval 612, the fifth iteration second memory cell threshold value 668 lies between the tenth classification interval 620 and the eleventh classification interval 622, and the fifth iteration third memory cell threshold value 670 lies between the fifteenth classification interval 630 and the sixteenth classification interval 632.

As shown in FIG. 6, in this example, in the fifth read iteration, it is determined that the determined level 428 is higher than the fifth iteration first memory cell threshold value 666 and lower than the fifth iteration second memory cell threshold value 668. Therefore, in the fifth read iteration, the second preliminary code "10" is preliminarily stored in a buffer memory (not shown in FIG. 6) and assigned to the determined level 428 for the fifth read iteration (symbolized in FIG. 6 with reference number 672).

Thus, in this example, the following preliminary codes are assigned to the determined level 428 in the respective read iterations:

first read iteration: third preliminary code "00";
second read iteration: third preliminary code "00";
third read iteration: second preliminary code "10";
fourth read iteration: second preliminary code "10";
fifth read iteration: second preliminary code "10".

Illustratively, the variation of the references form sliding reference windows with a step size of one classification interval in each iteration. Thus, a read resolution of one classification interval is achieved although only the predefined number of references (which is lower than the number of classification intervals, e.g., three references and 16 classification intervals) are used at the same time in each iteration.

Figure 7:
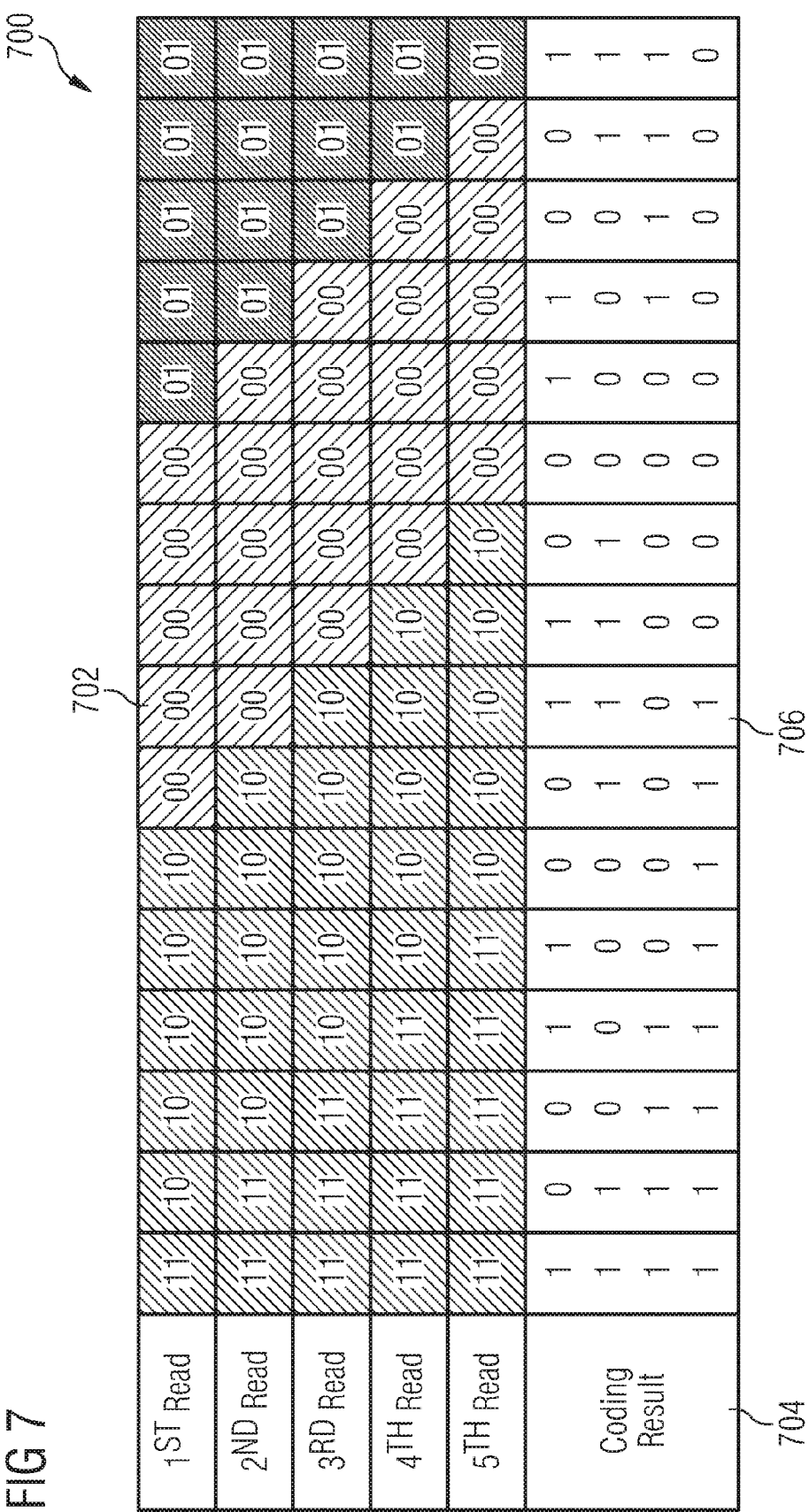
FIG. 7 shows a coding table in accordance with an embodiment of the invention.

FIG. 7 shows a coding table 700 in accordance with an embodiment of the invention.

Then, after having determined the preliminary codes of the iterations, using the coding table 700, the soft information will be determined. The coding table 700 may be stored in the memory cell arrangement 120 and may include a mapping of all possible results of the read iterations to a final soft information code 704. In this example, 16 final soft information codes 704 are provided. In the above example, the read iteration code sequence (in other words the results of the five read iterations) results in the eighth column 702, which defines a mapping to the final soft information code "1101" 706. The final soft information code "1101" 706 may then be output for further processing.

Illustratively, in various embodiments of the invention, the full set of references for the soft decoding is broken into more than one subset of references. The number of references in each subset may be equal to the maximum number of references that could be managed with a standard latch into a page buffer of the memory cell arrangement 120. In an embodiment of the invention, more than one read sequence is performed with different sets of references in order to cover all the sets. The memory cell arrangement controller 122 (e.g., a microcontroller) may re-build the soft information composing the multiple reads, e.g., using the coding table 700 described above. Thus, in an embodiment of the invention, in order to get soft information, the $V_t$-range is illustratively broken (uniformly or not uniformly) in more than ($2^N$) regions.

Figure 8:
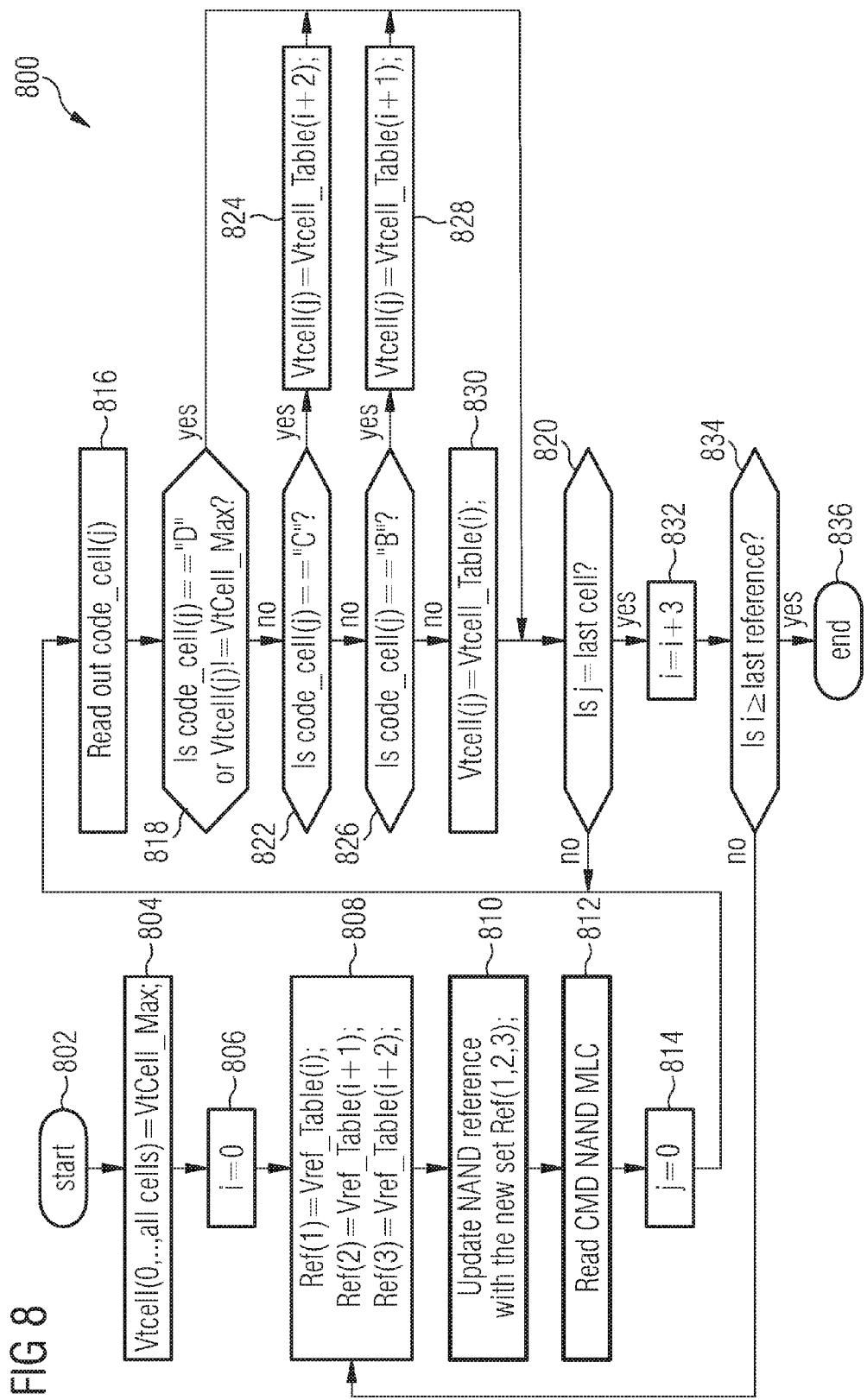
FIG. 8 shows a flow diagram for reading a memory cell state of a memory cell to be read, which could be used to recover soft information in accordance with an embodiment of the invention.

FIG. 8 shows a flow diagram 800 for reading a memory cell state of a memory cell to be read, which could be used to recover soft information in accordance with an embodiment of the invention.

In this embodiment, it is assumed that each memory cell provides four threshold voltage distributions.

Figure 9:
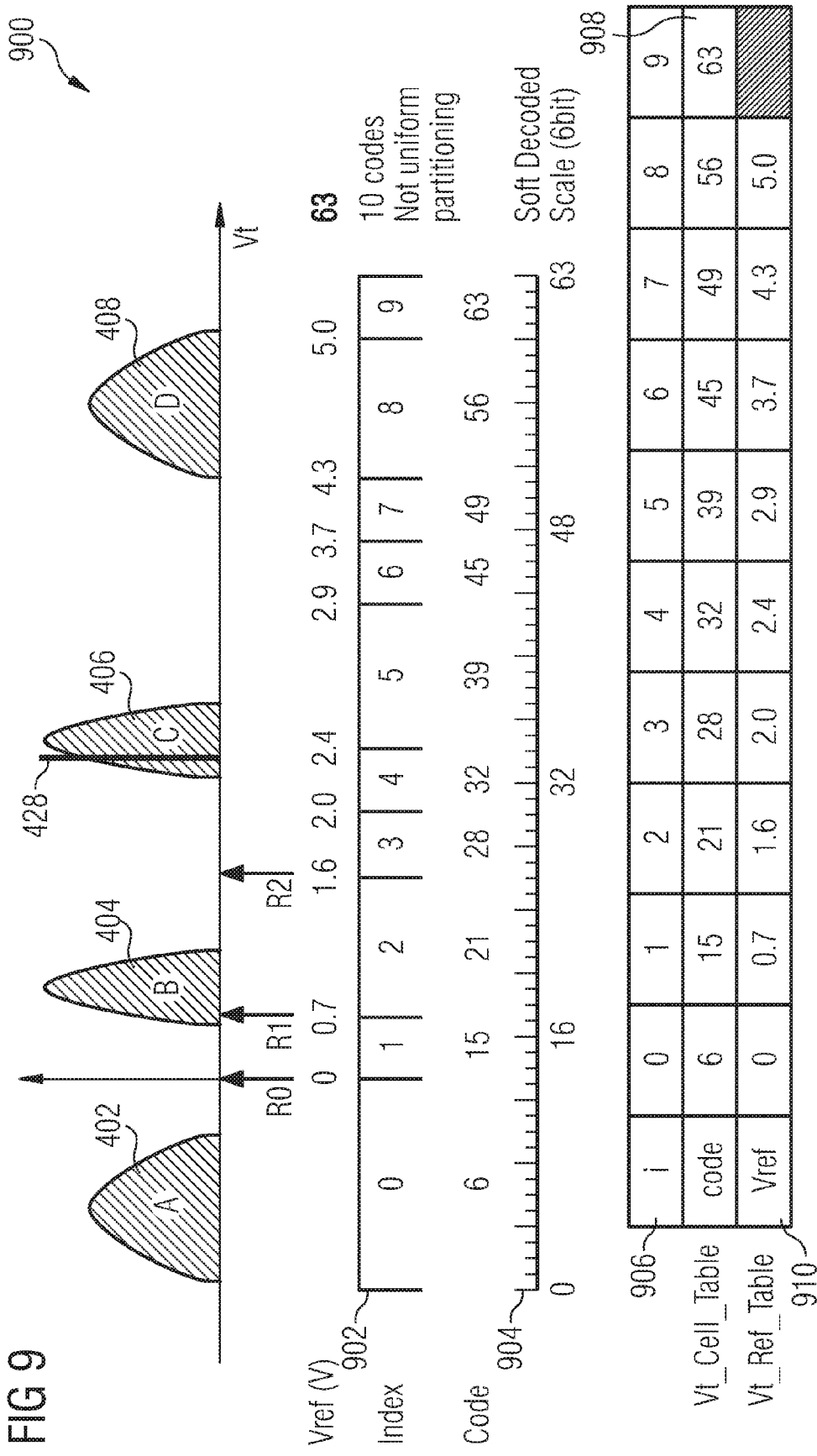
FIG. 9 shows another example of four possible states of 2-bit multi-level NAND memory cells and a corresponding coding table in accordance with an embodiment of the invention.

Furthermore, FIG. 9 shows another example of four possible states of 2-bit multi-level NAND memory cells and a corresponding coding table 906 in accordance with an embodiment of the invention in a diagram 900.

In this example, there is provided a set 902 of ten classification intervals (designated in FIG. 9 with index i=0, 1, 2, 3, 4, 5, 6, 7, 8, 9) which are provided in non-uniform partitions.

The soft decoded scale is selected to have 63 scales (designated in FIG. 9 with reference number 904). Furthermore, FIG. 9 shows a coding table 906, which in this example includes for each indexed classification interval i a respective code (shown in a code row 908, also referred to as threshold voltage cell table $V_t$_Cell_Table 908 in the following) that is assigned to the respective classification interval i and a memory cell threshold value row 910 (also referred to as reference threshold voltage table $V_t$_Ref_Table 910 in the following) that is assigned to the respective classification interval i, wherein the reference threshold voltage table $V_t$_Ref_Table 910 includes the memory cell threshold value (e.g., the reference threshold voltage value) that is provided as the lower edge of the respectively assigned classification interval i.

In this embodiment described with reference to FIG. 8 and FIG. 9, a method for reading a memory cell state of at least one memory cell of an integrated circuit starts in 802.

In 804, a buffer memory (e.g., the read buffer memory 214), e.g., a page buffer SRAM, which has as many memory cells as the number of memory cells, the memory cell state of which should be read, is initialized. In an embodiment of the invention, the initializing may include the setting of the buffer memory cells to a predefined initialization value. In an embodiment of the invention, the initializing may include the setting of the buffer memory cells to a predefined initialization value that represents a value that represents the highest threshold voltage (e.g., also referred to as $V_t$_Cell_Max). In an example, the predefined initialization value may be selected to be the value "63" (see FIG. 9). In other words, in this example, all buffer memory cells are set to the predefined initialization value "63" ($V_t\_Cell(i)$ (i=0, . . . , number of memory cells to be read).

Then, in 806, a reference index i is set to "0".

Subsequently, in a first read iteration, in 808, three references are selected, wherein in the example shown in FIG. 8 and FIG. 9, the following first iteration memory cell threshold values are provided:

- a first iteration first memory cell threshold value R0 (e.g., having a threshold value of 0 V) (Ref(1)=$V_t\_Ref\_Table$(0), see $V_t\_Ref\_Table$ 910 in FIG. 9);
- a first iteration second memory cell threshold value R1 (e.g., having a threshold value of 0.7 V) (Ref(2)=$V_t\_Ref\_Table$(1), see $V_t\_Ref\_Table$ 910 in FIG. 9); and
- a first iteration third memory cell threshold value R2 (e.g., having a threshold value of 1.6 V) (Ref(3)=$V_t\_Ref\_Table$(2), see $V_t\_Ref\_Table$ 910 in FIG. 9).

Then, in 810, the references (e.g., the NAND memory cell references) are provided in accordance with the selected three references.

Next, a read command is generated and a corresponding read partial operation is started in 812 and will be carried out on the memory cells to be read (which may be, as described above, e.g., multi-level memory cells or multi-bit memory cells), as will be described in more detail below.

Then, in 814, a memory cell index j is set to "0".

Then, in 816, the memory cells to be read (memory cell indicated with memory cell index j=0), in general the j-th memory cell is read. In other words, the code of memory cell j (code_cell(j)) is read, e.g., by applying predefined read voltages to the control lines of the addressed memory cell j and determining the threshold voltage of the addressed memory cell, e.g., by detecting the current flowing through the addressed memory cell and determining as to whether more than a predefined current flows through the addressed memory cell. In more detail, the information about the content of the memory cells to be read is moved from the memory cell array 202 to the at least one read buffer memory 214 (e.g., to the latches of the page buffer) in accordance with the NAND MLC Read command of 812. This may be carried out using a sequence of operations including, for example:

- set on the selected word line (WL) a first reference voltage ($V_{ref1}$);
- check for each read buffer memory 214 if the related memory cell has a threshold voltage that is higher or lower than the first reference voltage ($V_{ref1}$);
- set on the selected word line (WL) a second reference voltage ($V_{ref2}$);
- check for each read buffer memory 214 if the related memory cell has a threshold voltage that is higher or lower than the second reference voltage ($V_{ref2}$);
- set on the selected word line (WL) a third reference voltage ($V_{ref2}$);
- check for each read buffer memory 214 if the related memory cell has a threshold voltage that is higher or lower than the third reference voltage ($V_{ref3}$).

At the end of this sequence, there are two bits of information stored for each selected memory cell. Thus, block 816 illustrates that the two bits of information stored for each selected memory cell is determined.

Then, in 818, it is determined as to whether the determined threshold voltage of the addressed memory cell is higher than the highest one of the selected first iteration references, e.g., higher than the first iteration third memory cell threshold value R2 (e.g., having a threshold value of higher than 1.6 V).

If the determined threshold voltage of the addressed memory cell is higher than the first iteration third memory cell threshold value R2 ("Yes" in 818) (this illustratively means that with respect to the first iteration, the addressed memory cell would be preliminarily classified to have the state "01" ("D") with the highest threshold voltage), the process continues in 820, where it is determined whether the current memory cell is the last memory cell to be read in the first iteration.

In case no other memory cell has to be read in the first iteration ("Yes" in 820), the process continues in 832, which will be described in more detail below. In case another memory cell has to be read in the first iteration ("No" in 820), the memory cell index j is increased by "1" (illustratively, the next memory cell to be read in the first iteration is selected) (not shown in FIG. 8) and the process continues in 816 for the next selected memory cell (j+1).

Furthermore, in 818, it is determined as to whether the addressed memory cell has already been finally assigned a code value (the value that is preliminarily stored in the SRAM, for example (a value different from the predefined initialization value, e.g., the highest threshold voltage (e.g., also referred to as $V_t\_Cell\_Max$)). In other words, it is determined as to whether $V_t\_Cell(j)$ is not equal to $V_t\_Cell\_Max$. In case that the addressed memory cell has already been finally assigned a code value (i.e., e.g. $V_t\_Cell(j)$ is not equal to $V_t\_Cell\_Max$), the process continues in 820.

If the determined threshold voltage of the addressed memory cell is not higher than the first iteration third memory cell threshold value R2 ("No" in 818) and $V_t\_Cell(j)$ is equal to $V_t\_Cell\_Max$, in 822, it is then determined as to whether the determined threshold voltage of the addressed memory cell is higher than the second highest one of the selected first iteration references, e.g., higher than the first iteration second memory cell threshold value R1 (e.g., having a threshold value of higher than 0.7 V).

If the determined threshold voltage of the addressed memory cell is higher than the first iteration second memory cell threshold value R1 (but lower than the first iteration third memory cell threshold value, which has been already determined in 818) ("Yes" in 822) (this illustratively means that with respect to the first iteration, the addressed memory cell would be preliminarily classified to have the state "00" ("C") with the second highest threshold voltage), the process continues in 824, wherein the addressed memory cell will be finally assigned a code value, in this example the code value entry of the threshold voltage cell table $V_t\_Cell\_Table$ 908 that is assigned to the reference index i+2 (in this example, the code value "21", see FIG. 9, $V_t\_Cell(j)=V_t\_Cell\_Table(i+2)$, see FIG. 8). Then, the process continues in 820.

If the determined threshold voltage of the addressed memory cell is not higher than the first iteration second memory cell threshold value R1 ("No" in 822), in 826, it is then determined as to whether the determined threshold voltage of the addressed memory cell is higher than the third highest one (in this example also the lowest one) of the selected first iteration references, e.g., higher than the first iteration first memory cell threshold value R0 (e.g., having a threshold value of higher than 0 V).

If the determined threshold voltage of the addressed memory cell is higher than the first iteration first memory cell threshold value R0 (but lower than the first iteration second memory cell threshold value, which has been determined in 818) ("Yes" in 826) (this illustratively means that with respect to the first iteration, the addressed memory cell would be preliminarily classified to have the state "10" ("B") with the third highest threshold voltage), the process continues in 828, wherein the addressed memory cell will be finally assigned a code value, in this example the code value entry of the threshold voltage cell table $V_t$_Cell_Table 908 that is assigned to the reference index i+1 (in this example, the code value "15", see FIG. 9, $V_t$_Cell(j)=$V_t$_Cell_Table(i+1), see FIG. 8). Then, the process continues in 820.

If the determined threshold voltage of the addressed memory cell is not higher than the first iteration first memory cell threshold value R0 ("No" in 826) (this illustratively means that with respect to the first iteration, the addressed memory cell would be preliminarily classified to have the state "11" ("A") with the lowest threshold voltage), the process continues in 830, wherein the addressed memory cell will be finally assigned a code value, in this example the code value entry of the threshold voltage cell table $V_t$_Cell_Table 908 that is assigned to the reference index i (in this example, the code value "6", see FIG. 9, $V_t$_(j)=$V_t$_Cell_Table(i), see FIG. 8). Then, the process continues in 820.

Furthermore, in 832, the reference index i is increased by the predefined number of references provided (e.g., by the number "3") (i=i+3), in this example, i is increased to the value 3.

Then, in 834, it is determined as to whether the increased reference index i is equal to or greater than the total number of reference values provided in the process (in this example, the total number of reference values is 10), in other words, it is determined as to whether the increased reference index i is equal to or greater than the maximum reference index (in the example the maximum reference index is "9").

In case the increased reference index (i=i+3) is smaller than the maximum reference index ("No" in 834), a further iteration is carried out beginning in 808. In case the increased reference index (i=i+3) is equal to or greater than the maximum reference index ("Yes" in 834) the process continues in 836, the end of the process.

In this example, in a second iteration, again three references are selected, wherein in the example shown in FIG. 8 and FIG. 9, the following second iteration memory cell threshold values are provided:

a second iteration first memory cell threshold value R0 (e.g., having a threshold value of 2.0 V) (Ref(1)=$V_t$_Ref_Table(3), see $V_t$_Ref_Table 910 in FIG. 9);

a second iteration second memory cell threshold value R1 (e.g., having a threshold value of 2.4 V) (Ref(2)=$V_t$_Ref_Table(4), see $V_t$_Ref_Table 910 in FIG. 9); and a second iteration third memory cell threshold value R2 (e.g., having a threshold value of 2.9 V) (Ref(3)=$V_t$_Ref_Table(5), see $V_t$_Ref_Table 910 in FIG. 9).

The processes 810 to 834 in the second iteration are similar to the above described processes 810 to 834 in the first iteration, but in this iteration carried out with different (higher) references (in the second iteration, in this example, i=3) (e.g., the second iteration memory cell threshold values).

Therefore, only some of the processes in the second iteration will be described in the following in order to avoid unnecessary repetition.

In the second iteration, in 818, it is determined as to whether the determined threshold voltage of the addressed memory cell is higher than the highest one of the selected second iteration references, e.g., higher than the second iteration third memory cell threshold value R2 (e.g., having a threshold value of higher than 2.9 V).

If the determined threshold voltage of the addressed memory cell is higher than the second iteration third memory cell threshold value R2 ("Yes" in 818) (this illustratively means that with respect to the second iteration, the addressed memory cell would be preliminarily classified to have the state "01" ("D") with the highest threshold voltage), the process continues in 820

Furthermore, in 818, it is determined as to whether the addressed memory cell has already been finally assigned a code value (the value that is preliminarily stored in the SRAM, for example, (a value different from the predefined initialization value, e.g., the highest threshold voltage (e.g., also referred to as $V_t$_Cell_Max)). In other words, it is determined as to whether $V_t$_Cell(j) is not equal to $V_t$_Cell_Max. In case that the addressed memory cell has already been finally assigned a code value (e.g. in the first iteration) (i.e., e.g., $V_t$_Cell(j) is not equal to $V_t$_Cell_Max), the process continues in 820. This, it is avoided to re-classify the memory cell in case it has already been finally classified.

If the determined threshold voltage of the addressed memory cell is not higher than the second iteration third memory cell threshold value R2 ("No" in 818), in 822, it is then determined as to whether the determined threshold voltage of the addressed memory cell is higher than the second highest one of the selected second iteration references, e.g., higher than the second iteration second memory cell threshold value R1 (e.g., having a threshold value of higher than 2.4 V).

If the determined threshold voltage of the addressed memory cell is higher than the second iteration second memory cell threshold value R1 (but lower than the second iteration third memory cell threshold value, which has been determined in 818) ("Yes" in 822) (this illustratively means that with respect to the second iteration, the addressed memory cell would be preliminarily classified to have the state "00" ("C") with the second highest threshold voltage), the process continues in 824, wherein the addressed memory cell will be finally assigned a code value, in this example the code value entry of the threshold voltage cell table $V_t$_Cell_Table 908 that is assigned to the reference index i+2 (in this example, the code value "39", see FIG. 9, $V_t$_Cell(j)=$V_t$_Cell_Table(i+2), see FIG. 8). Then, the process continues in 820.

If the determined threshold voltage of the addressed memory cell is not higher than the second iteration second memory cell threshold value R1 ("No" in 822), in 826, it is then determined as to whether the determined threshold voltage of the addressed memory cell is higher than the third highest one (in this example also the lowest one) of the selected second iteration references, e.g., higher than the second iteration first memory cell threshold value R0 (e.g., having a threshold value of higher than 2.0 V).

If the determined threshold voltage of the addressed memory cell is higher than the second iteration first memory cell threshold value R0 (but lower than the second iteration second memory cell threshold value, which has been determined in 820) ("Yes" in 826) (this illustratively means that with respect to the second iteration, the addressed memory cell would be preliminarily classified to have the state "10" ("B") with the third highest threshold voltage), the process continues in 828, wherein the addressed memory cell will be finally assigned a code value, in this example the code value entry of the threshold voltage cell table $V_t$_Cell_Table 908 that is assigned to the reference index i+1 (in this example, the code value "32", see FIG. 9, $V_t$_Cell(j)=$V_t$_Cell_Table(i+1), see FIG. 8). Then, the process continues in 820.

If the determined threshold voltage of the addressed memory cell is not higher than the second iteration first memory cell threshold value R0 ("No" in 826) (this illustratively means that with respect to the second iteration, the addressed memory cell would be preliminarily classified to have the state "11" ("A") with the lowest threshold voltage), the process continues in 830, wherein the addressed memory cell will be finally assigned a code value, in this example the code value entry of the threshold voltage cell table $V_t$_Cell_Table 908 that is assigned to the reference index i (in this example, the code value "28", see FIG. 9, $V_t$_Cell(j)=$V_t$_Cell_Table(i), see FIG. 8). Then, the process continues in 820.

Furthermore, in 832, the reference index i is increased by the predefined number of references provided (e.g., by the value "3") (i=i+3), in this example, i is increased to the value 6.

In case the increased reference index (i=i+3) is not greater than the maximum reference index ("No" in 834), a further iteration is carried out beginning in 808, wherein, in this example in a third iteration, again three references are selected, wherein in the example shown in FIG. 8 and FIG. 9, the following third iteration memory cell threshold values are provided:
- a third iteration first memory cell threshold value R0 (e.g., having a threshold value of 3.7 V) (Ref(1)=$V_t$_Ref_Table(6), see $V_t$_Ref_Table 910 in FIG. 9);
- a third iteration second memory cell threshold value R1 (e.g. having a threshold value of 4.3 V) (Ref(2)=$V_t$_Ref_Table(7), see $V_t$_Ref_Table 910 in FIG. 9); and
- a third iteration third memory cell threshold value R2 (e.g. having a threshold value of 5.0 V) (Ref(3)=$V_t$_Ref_Table(8), see $V_t$_Ref_Table 910 in FIG. 9).

The processes 810 to 834 in the third iteration are similar to the above described processes 810 to 834 in the first iteration and second iteration, however, in this iteration carried out with different (again higher) references (in the third iteration, in this example, i=6) (e.g., the third iteration memory cell threshold values).

Therefore, only some of the processes in the third iteration will be described in the following in order to avoid unnecessary repetition.

In the third iteration, in 818, it is determined as to whether the determined threshold voltage of the addressed memory cell is higher than the highest one of the selected third iteration references, e.g., higher than the third iteration third memory cell threshold value R2 (e.g., having a threshold value of higher than 5.0 V).

If the determined threshold voltage of the addressed memory cell is higher than the third iteration third memory cell threshold value R2 ("Yes" in 818) (this illustratively means that with respect to the third iteration, the addressed memory cell would be preliminarily classified to have the state "01" ("D") with the highest threshold voltage), the process continues in 820.

Furthermore, in 818, it is determined as to whether the addressed memory cell has already been finally assigned a code value (the value that is preliminarily stored in the SRAM, for example, (a value different from the predefined initialization value, e.g., the highest threshold voltage (e.g., also referred to as $V_t$_Cell_Max)). In other words, it is determined as to whether $V_t$_Cell(j) is not equal to $V_t$_Cell_Max. In case that the addressed memory cell has already been finally assigned a code value (e.g., in the first iteration or in the second iteration) (i.e., e.g., $V_t$_Cell(j) is not equal to $V_t$_Cell_Max), the process continues in 820.

If the determined threshold voltage of the addressed memory cell is not higher than the third iteration third memory cell threshold value R2 ("No" in 818), in 822, it is then determined as to whether the determined threshold voltage of the addressed memory cell is higher than the second highest one of the selected third iteration references, e.g., higher than the third iteration second memory cell threshold value R1 (e.g., having a threshold value of higher than 4.3 V).

If the determined threshold voltage of the addressed memory cell is higher than the third iteration second memory cell threshold value R1 (but lower than the third iteration third memory cell threshold value, which has been determined in 818) ("Yes" in 822) (this illustratively means that with respect to the third iteration, the addressed memory cell would be preliminarily classified to have the state "00" ("C") with the second highest threshold voltage), the process continues in 824, wherein the addressed memory cell will be finally assigned a code value, in this example the code value entry of the threshold voltage cell table $V_t$_Cell_Table 908 that is assigned to the reference index i+2 (in this example, the code value "56", see FIG. 9, $V_t$_Cell(j)=$V_t$_Cell_Table(i+2), see FIG. 8). Then, the process continues in 820.

If the determined threshold voltage of the addressed memory cell is not higher than the third iteration second memory cell threshold value R1 ("No" in 822), in 826, it is then determined as to whether the determined threshold voltage of the addressed memory cell is higher than the third highest one (in this example also the lowest one) of the selected third iteration references, e.g., higher than the third iteration first memory cell threshold value R0 (e.g., having a threshold value of higher than 3.7 V).

If the determined threshold voltage of the addressed memory cell is higher than the third iteration first memory cell threshold value R0 (but lower than the third iteration second memory cell threshold value, which has been determined in 820) ("Yes" in 826) (this illustratively means that with respect to the third iteration, the addressed memory cell would be preliminarily classified to have the state "10" ("B") with the third highest threshold voltage), the process continues in 828, wherein the addressed memory cell will be finally assigned a code value, in this example the code value entry of the threshold voltage cell table $V_t$_Cell_Table 908 that is assigned to the reference index i+1 (in this example, the code value "49", see FIG. 9, $V_t$_Cell(j)=$V_t$_Cell_Table(i+1), see FIG. 8). Then, the process continues in 820.

If the determined threshold voltage of the addressed memory cell is not higher than the third iteration first memory cell threshold value R0 ("No" in 826) (this illustratively means that with respect to the third iteration, the addressed memory cell would be preliminarily classified to have the state "11" ("A") with the lowest threshold voltage), the process continues in 830, wherein the addressed memory cell will be finally assigned a code value, in this example the code value entry of the threshold voltage cell table $V_t$_Cell_Table 908 that is assigned to the reference index i (in this example, the code value "45", see FIG. 9, $V_t$_Cell(j)=$V_t$_Cell_Table(i), see FIG. 8). Then, the process continues in 820.

In this example, not yet finally assigned memory cells in all previous iterations have assigned the initialization value (e.g., of the highest threshold voltage ($V_t$_Cell_Max), e.g., the value 63) and thus has assigned the maximum value that can be assigned to any memory cell at all, thereby indicating that their memory cell state is the memory cell state being represented by the maximum threshold voltage (e.g., the fourth logic state "01" 416 ("D")).

Furthermore, in 832, the reference index i is increased by the predefined number of references provided (e.g., by the number "3") (i=i+3), in this example, i is increased to the value 9.

Thus, in this example, the value of i (i=9) is equal to the maximum reference index "9", and therefore, the process continues in 836, the end of the process. Thus, the result is the memory buffer (e.g., an SRAM) filled with the soft information (the code values of all the read memory cells. The soft information stored in the memory buffer may then be provided for further processing.

As will be described in more detail below, the further processing may be provided on the same die as the memory cell arrangement is provided or on another die or arrangement.

Figure 10:
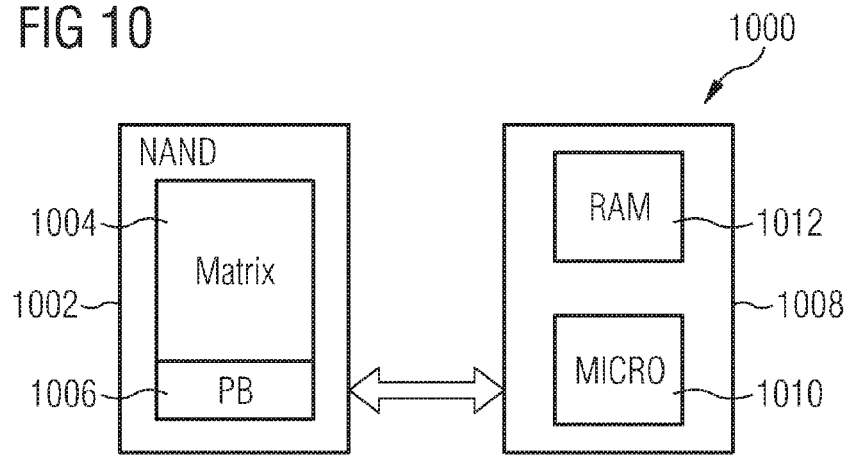
FIG. 10 shows a memory system in accordance with an embodiment of the invention.

FIG. 10 shows a memory system 1000 in accordance with an embodiment of the invention.

In this embodiment, a memory cell arrangement 1002 (e.g., a memory cell arrangement as described above) is provided, which may include (in addition to, e.g., the components described with reference to the computer system 100 in FIGS. 1 and 2) a memory cell field 1004 (e.g., a NAND memory cell field 1004) and a page buffer 1006.

In this embodiment, the task of further processing or using the soft information provided by the buffer memory is provided for a memory cell arrangement 1002 external processing device 1008 such as, e.g., the computer arrangement 102 described above. The external processing device 1008 may include a microcontroller 1010 and a RAM 1012.

In an embodiment of the invention, the memory cell arrangement 1002 may provide the following features:
- $2^N-1$ memory internal read partial operations to output N bit;
- a dedicated command to set the $2^N-1$ memory internal reference, e.g., reference voltages.

In an embodiment of the invention, the microcontroller 1010 may in its internal memory (e.g., the RAM 1012) re-build soft information using the process described above (e.g., with reference to FIGS. 8 and 9). The microcontroller 1010 may be configured to manage the memory cell arrangement 1002 to update its reference and to perform all read operations being requested.

Figure 11:
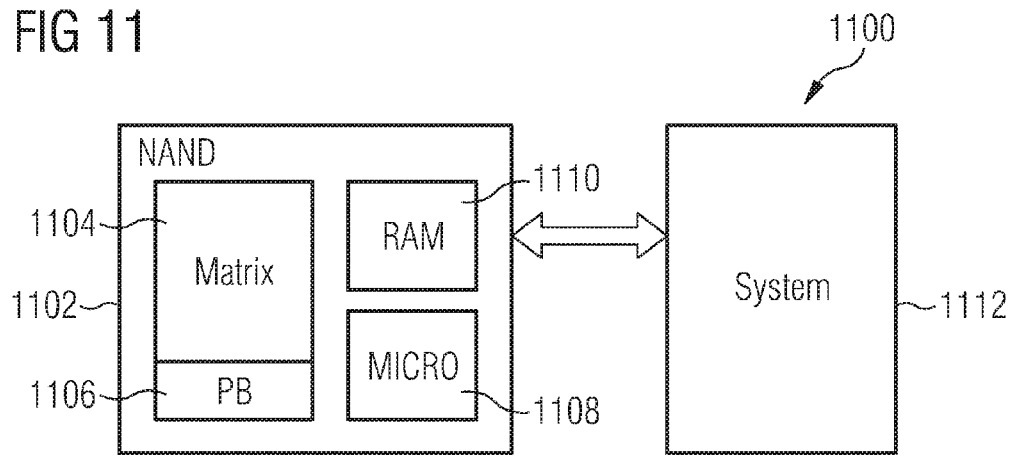
FIG. 11 shows a memory system in accordance with another embodiment of the invention.

FIG. 11 shows a memory system 1100 in accordance with another embodiment of the invention.

In this embodiment, a memory cell arrangement 1102 (e.g., a memory cell arrangement as described above) is provided, which may include (in addition to, e.g., the components described with reference to the computer system 100 in FIGS. 1 and 2) a memory cell field 1104 (e.g., a NAND memory cell field 1104) and a page buffer 1106. Furthermore, the memory cell arrangement 1102 may include an embedded processor 1108 (e.g., a microprocessor 1108) and a RAM 1110.

In this embodiment of the invention, the task to rebuild the soft information is taken over by the memory cell arrangement 1102 itself, and more particular by its embedded processor 1108 and RAM 1110.

The memory cell arrangement 1102 may directly output the soft information to a connected processing system 1112

In this embodiment of the invention, the embedded processor 1108 may control the re-building of the soft information and thereby manage the memory cell arrangement 1102 circuits in order to change the references and to perform the read operations in accordance with the processes as described above (e.g., with reference to FIGS. 8 and 9).

In an embodiment of the invention, the further processing of the soft information may be carried out within the memory cell arrangement or external to it.

Figure 12:
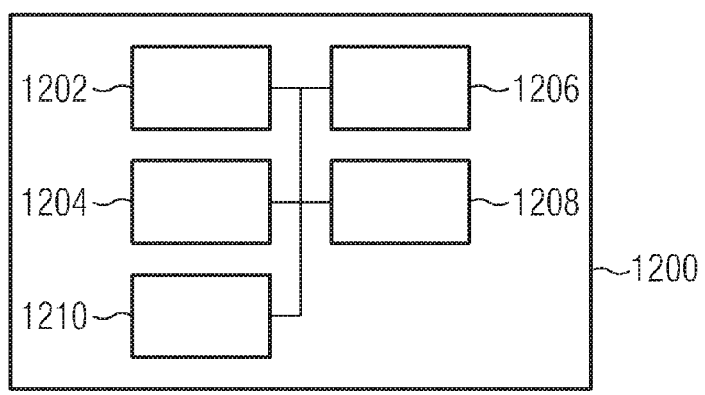
FIG. 12 shows an integrated circuit having a memory cell arrangement in accordance with an embodiment of the invention.

FIG. 12 shows an integrated circuit having a memory cell arrangement 1200 in accordance with an embodiment of the invention.

In an embodiment of the invention, the memory cell arrangement 1200 may include a memory cell field 1202 having at least one memory cell, e.g., a plurality of memory cells. In an embodiment of the invention, the memory cell may be capable of storing a plurality of memory cell states being distinguishable by a predefined number of memory cell threshold values. Furthermore, the memory cell arrangement 1200 may include a controller 1204 configured to read a memory cell state of the at least one memory cell using a number of reference levels that are higher than the predefined number of memory cell threshold values, wherein the reading comprises a first partial reading using a first set of a plurality of reference levels and a second partial reading using a second set of a plurality of reference levels, wherein the second set of a plurality of reference levels comprises at least one reference level which is different from the reference levels of the first set of a plurality of reference levels.

The memory cells may be arranged in a memory array. In an embodiment of the invention, the plurality of memory cells may be arranged in the memory field in a matrix form in rows and columns or in a zig-zag form or in any other desired or suitable architecture.

Furthermore, the memory cell arrangement 1200 may optionally further include at least one read buffer memory cell 1206 being coupled to the at least one memory cell. In an embodiment of the invention, the number of read buffer memory cells may be equal to or greater than the number of bits used to represent the memory cell states of the at least one memory cell field 1202. In an embodiment of the invention, the memory cells of the read memory are random access memory cells, for example, static random access memory cells.

In an embodiment of the invention, the number of reference levels in the first set of a plurality of reference levels or the number of reference levels in the second set of a plurality of reference levels may correspond to the maximum number of reference levels that can be processed with the provided number of read buffer memory cells.

Furthermore, the memory cell arrangement 1200 may optionally further include a reference level memory 1208 configured to store reference level values of the reference levels provided for the reference levels in the first set of a plurality of reference levels or the number of reference levels in the second set of a plurality of reference levels.

In another embodiment of the invention, the controller 1204 may be configured to determine soft decision output information about the memory cell state of the at least one memory cell from the results of the first partial reading and the second partial reading.

Furthermore, the controller 1204 may be configured such that the reading of the memory cell state of the at least one memory cell includes:
- determining at least one electrical characteristic of the at least one memory cell,
- selecting a first reference level value for a first reference level of the first set of a plurality of reference levels and a second reference level value for a second reference level of the first set of a plurality of reference levels,
- determining as to whether the read of at least one electrical characteristic fulfills a first predefined criterion represented by the first selected reference level value, and, in case that the read of at least one electrical characteristic fulfills the first predefined criterion, classifying the at least one memory cell as fulfilling the first predefined criterion, and
- determining as to whether the read of at least one electrical characteristic fulfills a second predefined criterion represented by the second selected reference level value, and, in case that the read of at least one electrical characteristic fulfills the second predefined criterion, classifying the at least one memory cell as fulfilling the second predefined criterion.

The determined at least one electrical characteristic may include or be at least one of an electric current or electric voltage.

Moreover, the controller 1204 may be configured such that the reading of the memory cell state of the at least one memory cell further includes in case that the read of at least one electrical characteristic neither fulfills the first predefined criterion nor the second predefined criterion, classifying the at least one memory cell into a predefined class.

In an embodiment of the invention, the controller 1204 may be configured such that the reading of the memory cell state of the at least one memory cell further includes in case that the read of at least one memory cell is classified as fulfilling the first predefined criterion or the second predefined criterion, the classification of the at least one memory cell will not be re-classified.

In another embodiment of the invention, the controller 1204 may be configured such that the reading of the memory cell state of the at least one memory cell further includes:

selecting a first reference level value for a first reference level of the second set of a plurality of reference levels and a second reference level value for a second reference level of the second set of a plurality of reference levels, determining as to whether the read of at least one electrical characteristic fulfills a third predefined criterion represented by the first selected reference level value, and, in case that the read of at least one electrical characteristic fulfills the third predefined criterion, classifying the at least one memory cell as fulfilling the third predefined criterion, and determining as to whether the read of at least one electrical characteristic fulfills a fourth predefined criterion represented by the second selected reference level value, and, in case that the read of at least one electrical characteristic fulfills the fourth predefined criterion, classifying the at least one memory cell as fulfilling the fourth predefined criterion.

Furthermore, the controller 1204 may be configured such that the reading of the memory cell state of the at least one memory cell further includes in case that the read of at least one memory cell is classified as fulfilling the third predefined criterion or the fourth predefined criterion, providing that the classification of the at least one memory cell will not be re-classified.

In another embodiment, the controller 1204 may be configured such that the reading of the memory cell state of the at least one memory cell further includes in case that the read of at least one electrical characteristic neither fulfills the third predefined criterion nor the fourth predefined criterion, classifying the at least one memory cell into a predefined class.

The classifying of the at least one memory cell into the predefined class may include assigning a predefined class code to the at least one memory cell. Furthermore, the predefined class may represent a class of the maximum memory cell threshold value of the at least one memory cell.

In an embodiment of the invention, at least one reference level value of the second set of a plurality of reference levels is greater than at least one reference level value of the first set of a plurality of reference levels.

In the embodiment, in which the integrated circuit includes at least one read buffer memory cell being coupled to the at least one memory cell, the controller 1204 may be configured such that the reading of the memory cell state of the at least one memory cell further includes initializing the read buffer memory cell to a predefined memory cell content.

Furthermore, the memory cell arrangement 1200 may optionally further include at least one post-processing circuit 1210 configured to post-process the result of the read of the memory cell state of the at least one memory cell. The at least one post-processing circuit 1210 may include or be an error detection circuit and/or an error correction circuit.

In an embodiment of the invention, the error correction circuit may be configured to post-process the result of the read of the memory cell state of the at least one memory cell using a low-density parity-check code (LDPC code).

In another embodiment of the invention, the at least one post-processing circuit 1210 may be configured to post-process the result of the read of the memory cell state of the at least one memory cell using a trellis-based decoding.

Figure 13:
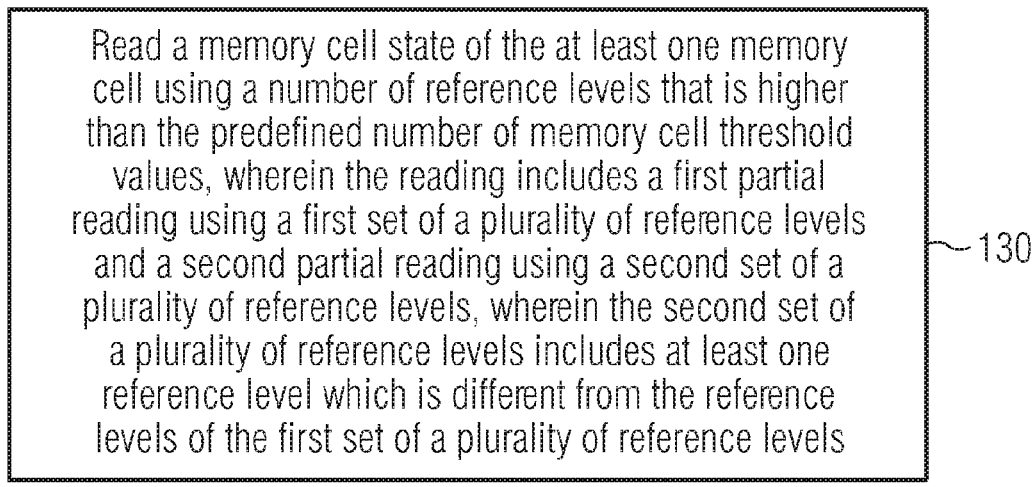
FIG. 13 shows a flow diagram illustrating a method for reading a memory cell state of at least one memory cell of an integrated circuit in accordance with an embodiment of the invention.

FIG. 13 shows a flow diagram 1300 illustrating a method for reading a memory cell state of at least one memory cell of an integrated circuit in accordance with an embodiment of the invention. The memory cell may be capable of storing a plurality of memory cell states being distinguishable by a predefined number of memory cell threshold values. In an embodiment of the invention, the method may include in 1302 reading a memory cell state of the at least one memory cell using a number of reference levels that is higher than the predefined number of memory cell threshold values, wherein the reading includes a first partial reading using a first set of a plurality of reference levels and a second partial reading using a second set of a plurality of reference levels, wherein the second set of a plurality of reference levels includes at least one reference level which is different from the reference levels of the first set of a plurality of reference levels.

In an embodiment of the method, it may further be provided to store reference level values of the reference levels provided for the reference levels in the first set of a plurality of reference levels or the number of reference levels in the second set of a plurality of reference levels in a reference level memory.

The method may further include determining soft decision output information about the memory cell state of the at least one memory cell from the results of the first partial reading and the second partial reading.

In another embodiment of the method, the reading of the memory cell state of the at least one memory cell may include:

determining at least one electrical characteristic of the at least one memory cell, selecting a first reference level value for a first reference level of the first set of a plurality of reference levels and a second reference level value for a second reference level of the first set of a plurality of reference levels, determining as to whether the read of at least one electrical characteristic fulfills a first predefined criterion represented by the first selected reference level value, and, in case that the read of at least one electrical characteristic fulfills the first predefined criterion, classifying the at least one memory cell as fulfilling the first predefined criterion, determining as to whether the read of at least one electrical characteristic fulfills a second predefined criterion represented by the second selected reference level value, and, in case that the read of at least one electrical characteristic fulfills the second predefined criterion, classifying the at least one memory cell as fulfilling the second predefined criterion.

The determined at least one electrical characteristic may include or may be at least one of an electric current or electric voltage.

In another embodiment of the method, the reading of the memory cell state of the at least one memory cell may further include in case that the read of at least one electrical characteristic neither fulfills the first predefined criterion nor the second predefined criterion, classifying the at least one memory cell in a predefined class.

In another embodiment of the method, the reading of the memory cell state of the at least one memory cell may further include in case that the read of at least one memory cell is classified as fulfilling the first predefined criterion or the second predefined criterion, providing that the classification of the at least one memory cell will not be re-classified.

In yet another embodiment of the method, the reading of the memory cell state of the at least one memory cell may further include:
- selecting a first reference level value for a first reference level of the second set of a plurality of reference levels and a second reference level value for a second reference level of the second set of a plurality of reference levels,
- determining as to whether the read of at least one electrical characteristic fulfills a third predefined criterion represented by the first selected reference level value, and, in case that the read of at least one electrical characteristic fulfills the third predefined criterion, classifying the at least one memory cell as fulfilling the third predefined criterion, and
- determining as to whether the read of at least one electrical characteristic fulfills a fourth predefined criterion represented by the second selected reference level value, and, in case that the read of at least one electrical characteristic fulfills the fourth predefined criterion, classifying the at least one memory cell as fulfilling the fourth predefined criterion.

Furthermore, in another embodiment of the method, the reading of the memory cell state of the at least one memory cell may further include in case that the read of at least one memory cell is classified as fulfilling the third predefined criterion or the fourth predefined criterion, providing that the classification of the at least one memory cell will not be re-classified.

Furthermore, in another embodiment of the method, the reading of the memory cell state of the at least one memory cell may further include in case that the read at least one electrical characteristic neither fulfills the third predefined criterion nor the fourth predefined criterion, classifying the at least one memory cell into a predefined class.

The classifying of the at least one memory cell in the predefined class may include assigning a predefined class code to the at least one memory cell.

The predefined class may represent a class of the maximum memory cell threshold value of the at least one memory cell.

In an embodiment of the invention, at least one reference level value of the second set of a plurality of reference levels may be greater than at least one reference level value of the first set of a plurality of reference levels.

In the embodiment of the invention, in which the integrated circuit further includes at least one read buffer memory cell being coupled to the at least one memory cell, the reading of the memory cell state of the at least one memory cell may further include initializing the read buffer memory cell to a predefined memory cell content.

In an embodiment of the invention, the method may include post-processing the result of the read of the memory cell state of the at least one memory cell.

The post-processing the result of the read of the memory cell state of the at least one memory cell may include an error detection and/or an error correction.

In an embodiment of the invention, the error correction is carried out using a low-density parity-check code.

Furthermore, the post-processing may be carried out using a trellis-based decoding.

In another embodiment of the invention, an integrated circuit having a memory cell arrangement is provided. The memory cell arrangement may include:
- at least one memory cell, the memory cell being capable of storing a plurality of memory cell states being distinguishable by a predefined number of memory cell threshold values, and
- a controller configured to read a memory cell state of the at least one memory cell using a total number of reference levels that is higher than the number of reference levels that can be processed at the same time, wherein the reading comprises a first partial reading using a first set of a plurality of reference levels and a second partial reading using a second set of a plurality of reference levels, wherein the second set of a plurality of reference levels comprises at least one reference level which is different from the reference levels of the first set of a plurality of reference levels.

In another embodiment of the invention, a method for reading a memory cell state of at least one memory cell of an integrated circuit is provided. The at least one memory cell may be capable of storing a plurality of memory cell states being distinguishable by a predefined number of memory cell threshold values. The method may include reading a memory cell state of the at least one memory cell using a number of reference levels that is higher than the number of reference levels that can be processed at the same time, wherein the reading comprises a first partial reading using a first set of a plurality of reference levels and a second partial reading using a second set of a plurality of reference levels, wherein the second set of a plurality of reference levels comprises at least one reference level which is different from the reference levels of the first set of a plurality of reference levels.

Figure 14A:
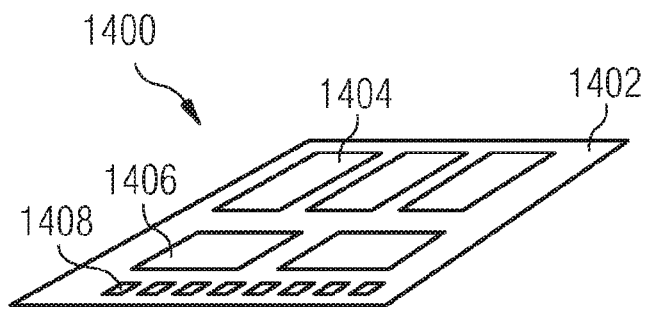
FIGS. 14A and 14B show a memory module (FIG. 14A) and a stackable memory module (FIG. 14B) in accordance with an embodiment of the invention.
Figure 14B:
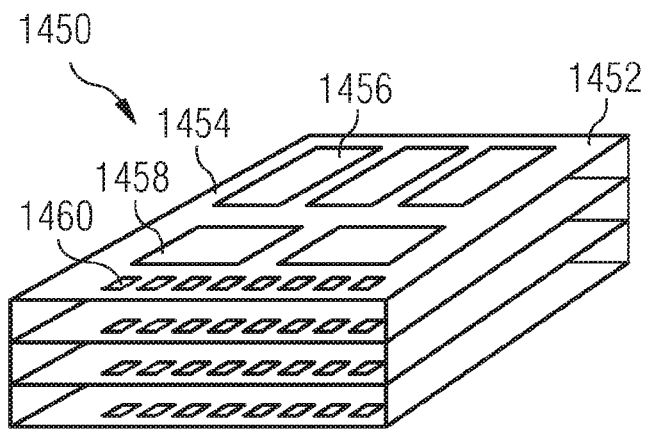

As shown in FIGS. 14A and 14B, in some embodiments, memory devices such as those described herein may be used in modules.

In FIG. 14A, a memory module 1400 is shown, on which one or more memory devices 1404 are arranged on a substrate 1402. The memory device 1404 may include numerous memory cells, each of which uses a memory element in accordance with an embodiment of the invention. The memory module 1400 may also include one or more electronic devices 1406, which may include memory, processing circuitry, control circuitry, addressing circuitry, bus interconnection circuitry, or other circuitry or electronic devices that may be combined on a module with a memory device, such as the memory device 1404. Additionally, the memory module 1400 includes multiple electrical connections 1408, which may be used to connect the memory module 1400 to other electronic components, including other modules.

As shown in FIG. 14B, in some embodiments, these modules may be stackable, to form a stack 1450. For example, a stackable memory module 1452 may contain one or more memory devices 1456, arranged on a stackable substrate 1454. The memory device 1456 contains memory cells that employ memory elements in accordance with an embodiment of the invention. The stackable memory module 1452 may also include one or more electronic devices 1458, which may include memory, processing circuitry, control circuitry, addressing circuitry, bus interconnection circuitry, or other circuitry or electronic devices that may be combined on a module with a memory device, such as the memory device 1456. Electrical connections 1460 are used to connect the stackable memory module 1452 with other modules in the stack 1450, or with other electronic devices. Other modules in the stack 1450 may include additional stackable memory modules, similar to the stackable memory module 1452 described above, or other types of stackable modules, such as stackable processing modules, control modules, communication modules, or other modules containing electronic components.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit having a memory cell arrangement, the memory cell arrangement comprising:
   at least one memory cell, the memory cell being capable of storing a plurality of memory cell states being distinguishable by a predefined number of memory cell threshold values; and
   a controller configured to read a memory cell state of the at least one memory cell using a number of reference levels that is higher than the predefined number of memory cell threshold values, wherein the reading comprises a first partial reading using a first set of a plurality of reference levels and a second partial reading using a second set of a plurality of reference levels, wherein the second set of the plurality of reference levels comprises at least one reference level which is different from the reference levels of the first set of the plurality of reference levels.

2. The integrated circuit of claim 1, wherein the at least one memory cell is a non-volatile memory cell.

3. The integrated circuit of claim 1, wherein the at least one memory cell comprises a plurality of memory cells.

4. The integrated circuit of claim 1, further comprising:
   at least one read buffer memory cell coupled to the at least one memory cell.

5. The integrated circuit of claim 4, wherein a number of read buffer memory cells is equal to or greater than a number of bits used to represent the memory cell states of the at least one memory cell.

6. The integrated circuit of claim 5, wherein the number of reference levels in the first set of the plurality of reference levels or the number of reference levels in the second set of the plurality of reference levels corresponds to a maximum number of reference levels that can be processed with the provided number of read buffer memory cells.

7. The integrated circuit of claim 1, further comprising:
   a reference level memory configured to store reference level values of the reference levels provided for the reference levels in the first set of the plurality of reference levels or the number of reference levels in the second set of the plurality of reference levels.

8. The integrated circuit of claim 1, wherein the controller is configured to determine soft decision output information about the memory cell state of the at least one memory cell from the results of the first partial reading and the second partial reading.

9. The integrated circuit of claim 1, wherein the controller is configured such that the reading of the memory cell state of the at least one memory cell comprises:
   determining at least one electrical characteristic of the at least one memory cell;
   selecting a first reference level value for a first reference level of the first set of the plurality of reference levels and a second reference level value for a second reference level of the first set of the plurality of reference levels;
   determining whether a read of the at least one electrical characteristic fulfills a first predefined criterion represented by the first selected reference level value, and, in case that the read of the at least one electrical characteristic fulfills the first predefined criterion, classifying the at least one memory cell as fulfilling the first predefined criterion; and
   determining whether the read of the at least one electrical characteristic fulfills a second predefined criterion represented by the second selected reference level value, and, in case that the read of the at least one electrical characteristic fulfills the second predefined criterion, classifying the at least one memory cell as fulfilling the second predefined criterion.

10. The integrated circuit of claim 9, wherein the controller is configured such that reading the memory cell state of the at least one memory cell further comprises:
    classifying the at least one memory cell in a predefined class when the read of the at least one electrical characteristic neither fulfills the first predefined criterion nor the second predefined criterion.

11. The integrated circuit of claim 10, wherein the controller is configured such that the reading of the memory cell state of the at least one memory cell further comprises:
    providing that the classification of the at least one memory cell will not be re-classified when the read of the at least one memory cell is classified as fulfilling the first predefined criterion or the second predefined criterion.

12. The integrated circuit of claim 9, wherein the controller is configured such that the reading of the memory cell state of the at least one memory cell further comprises:
    selecting a first reference level value for a first reference level of the second set of the plurality of reference levels and a second reference level value for a second reference level of the second set of the plurality of reference levels;
    determining whether the read of the at least one electrical characteristic fulfills a third predefined criterion represented by the first selected reference level value, and, in case that the read of the at least one electrical characteristic fulfills the third predefined criterion, classifying the at least one memory cell as fulfilling the third predefined criterion; and
    determining whether the read of the at least one electrical characteristic fulfills a fourth predefined criterion represented by the second selected reference level value, and, in case that the read of the at least one electrical characteristic fulfills the fourth predefined criterion, classifying the at least one memory cell as fulfilling the fourth predefined criterion.

13. The integrated circuit of claim 12, wherein the controller is configured such that the reading of the memory cell state of the at least one memory cell further comprises:
    providing that the classification of the at least one memory cell will not be re-classified when the read of the at least one memory cell is classified as fulfilling the third predefined criterion or the fourth predefined criterion.

14. The integrated circuit of claim 13, wherein the controller is configured such that the reading of the memory cell state of the at least one memory cell further comprises:
classifying at least one memory cell in a predefined class when the read of the at least one electrical characteristic neither fulfills the third predefined criterion nor the fourth predefined criterion.

15. The integrated circuit of claim 14, wherein the predefined class represents a class of a maximum memory cell threshold value of the at least one memory cell.

16. The integrated circuit of claim 9, wherein at least one reference level value of the second set of the plurality of reference levels is greater than at least one reference level value of the first set of the plurality of reference levels.

17. The integrated circuit of claim 1, further comprising:
at least one post-processing circuit configured to post-process the result of the read of the memory cell state of the at least one memory cell.

18. A method for reading a memory cell state of at least one memory cell of an integrated circuit, wherein the memory cell is capable of storing a plurality of memory cell states being distinguishable by a predefined number of memory cell threshold values, the method comprising:
reading the memory cell state of the at least one memory cell using a number of reference levels that is higher than the predefined number of memory cell threshold values, wherein the reading comprises a first partial reading using a first set of a plurality of reference levels and a second partial reading using a second set of a plurality of reference levels, wherein the second set of the plurality of reference levels comprises at least one reference level which is different from the reference levels of the first set of the plurality of reference levels.

19. The method of claim 18, wherein the reading of the memory cell state of the at least one memory cell comprises:
determining at least one electrical characteristic of the at least one memory cell;
selecting a first reference level value for a first reference level of the first set of the plurality of reference levels and a second reference level value for a second reference level of the first set of the plurality of reference levels;
determining whether a read of the at least one electrical characteristic fulfills a first predefined criterion represented by the first selected reference level value, and, in case that the read of the at least one electrical characteristic fulfills the first predefined criterion, classifying the at least one memory cell as fulfilling the first predefined criterion; and
determining whether the read of the at least one electrical characteristic fulfills a second predefined criterion represented by the second selected reference level value, and, in case that the read of the at least one electrical characteristic fulfills the second predefined criterion, classifying the at least one memory cell as fulfilling the second predefined criterion.

20. The method of claim 19, wherein the reading of the memory cell state of the at least one memory cell further comprises:
selecting a first reference level value for a first reference level of the second set of the plurality of reference levels and a second reference level value for a second reference level of the second set of the plurality of reference levels;
determining whether the read of the at least one electrical characteristic fulfills a third predefined criterion represented by the first selected reference level value, and, in case that the read of the at least one electrical characteristic fulfills the third predefined criterion, classifying the at least one memory cell as fulfilling the third predefined criterion; and
determining whether the read of the at least one electrical characteristic fulfills a fourth predefined criterion represented by the second selected reference level value, and, in case that the read of the at least one electrical characteristic fulfills the fourth predefined criterion, classifying the at least one memory cell as fulfilling the fourth predefined criterion.

21. The method of claim 19, wherein the reading of the memory cell state of the at least one memory cell further comprises:
classifying the at least one memory cell in a predefined class when the read of the at least one electrical characteristic does not fulfill any predefined criterion.

22. The method of claim 19, wherein the reading of the memory cell state of the at least one memory cell further comprises:
providing that the classification of the at least one memory cell will not be re-classified when the read at least one memory cell is classified as fulfilling one of the predefined criteria.

23. An integrated circuit having a memory cell arrangement, the memory cell arrangement comprising:
at least one memory cell, the memory cell being capable of storing a plurality of memory cell states being distinguishable by a predefined number of memory cell threshold values; and
a controller configured to read a memory cell state of the at least one memory cell using a total number of reference levels that is higher than the number of reference levels that can be processed at the same time, wherein the reading comprises a first partial reading using a first set of a plurality of reference levels and a second partial reading using a second set of a plurality of reference levels, wherein the second set of the plurality of reference levels comprises at least one reference level which is different from the reference levels of the first set of the plurality of reference levels.

24. A method for reading a memory cell state of at least one memory cell of an integrated circuit, wherein the memory cell is capable of storing a plurality of memory cell states being distinguishable by a predefined number of memory cell threshold values, the method comprising:
reading a memory cell state of the at least one memory cell using a number of reference levels that is higher than the number of reference levels that can be processed at the same time, wherein the reading comprises a first partial reading using a first set of a plurality of reference levels and a second partial reading using a second set of a plurality of reference levels, wherein the second set of the plurality of reference levels comprises at least one reference level which is different from the reference levels of the first set of the plurality of reference levels.

25. A memory module, comprising:
a plurality of integrated circuits, wherein at least one integrated circuit of the plurality of integrated circuits comprises a memory cell arrangement, the memory cell arrangement comprising:
at least one memory cell, the memory cell being capable of storing a plurality of memory cell states being distinguishable by a predefined number of memory cell threshold values; and
a controller configured to read a memory cell state of the at least one memory cell using a number of reference levels that is higher than the predefined number of memory cell threshold values, wherein the reading comprises a first partial reading using a first set of a plurality of reference levels and a second partial reading using a second set of a plurality of reference levels, wherein the second set of the plurality of reference levels comprises at least one reference level which is different from the reference levels of the first set of the plurality of reference levels.

* * * * *